(12) United States Patent
Kim et al.

(10) Patent No.: US 12,532,581 B2
(45) Date of Patent: Jan. 20, 2026

(54) DISPLAY DEVICE AND METHOD FOR FABRICATING THE SAME

(71) Applicant: Samsung Display Co., LTD., Yongin-si (KR)

(72) Inventors: Young Rok Kim, Anyang-si (KR); Kyu Soon Park, Yongin-si (KR); Jong Hyun Choung, Suwon-si (KR); Woo Jin Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 734 days.

(21) Appl. No.: 17/881,978

(22) Filed: Aug. 5, 2022

(65) Prior Publication Data

US 2023/0197901 A1    Jun. 22, 2023

(30) Foreign Application Priority Data

Dec. 17, 2021   (KR) ................. 10-2021-0181807

(51) Int. Cl.
| | | |
|---|---|---|
| *H10H 20/831* | (2025.01) | |
| *H10H 20/01* | (2025.01) | |
| *H10H 20/857* | (2025.01) | |
| *H10H 29/14* | (2025.01) | |

(52) U.S. Cl.
CPC ........ *H10H 20/8312* (2025.01); *H10H 20/01* (2025.01); *H10H 20/857* (2025.01); *H10H 29/142* (2025.01); *H10H 20/032* (2025.01); *H10H 20/0364* (2025.01)

(58) Field of Classification Search
CPC .. H10H 20/8312; H10H 20/01; H10H 20/857; H10H 29/142; H10H 20/032; H10H 20/0364; H10H 20/819; H10H 20/831; H10H 20/84; H10H 20/8506;
(Continued)

(56) References Cited

U.S. PATENT DOCUMENTS

| | | |
|---|---|---|
| 11,574,970 B2 | 2/2023 | Kim et al. |
| 12,161,027 B2 | 12/2024 | Kim et al. |
| 2021/0036076 A1* | 2/2021 | Kim ............ H10K 59/124 |

(Continued)

FOREIGN PATENT DOCUMENTS

| | | |
|---|---|---|
| KR | 10-2020-0115868 | 10/2020 |
| KR | 10-2021-0014233 A | 2/2021 |
| KR | 10-2021-0143969 A | 11/2021 |

*Primary Examiner* — Ratisha Mehta
*Assistant Examiner* — Sophia W Kao
(74) *Attorney, Agent, or Firm* — Womble Bond Dickinson (US) LLP

(57) ABSTRACT

A display device comprises a via layer disposed on a substrate, a first electrode and a second electrode disposed on the via layer and spaced apart from each other, a first insulating layer disposed on the first electrode and the second electrode, light emitting elements disposed on the first insulating layer and disposed on the first electrode and the second electrode, a bank layer disposed on the first insulating layer and comprising a first opening in which the light emitting elements are disposed and a second opening spaced apart from the first opening, a second insulating layer disposed on the light emitting elements, and a first contact electrode and a second contact electrode disposed on the bank layer, the light emitting elements, and the second insulating layer while being spaced apart from each other.

9 Claims, 16 Drawing Sheets

(58) Field of Classification Search
CPC . H01L 25/167; H01L 25/0753; H10D 86/021; H10D 86/40
See application file for complete search history.

(56) References Cited

U.S. PATENT DOCUMENTS

| | | | | |
|---|---|---|---|---|
| 2021/0151499 | A1 | 5/2021 | Park et al. | |
| 2021/0367024 | A1* | 11/2021 | Kim | H10K 59/131 |
| 2021/0376281 | A1* | 12/2021 | Kim | H10K 50/822 |
| 2023/0246139 | A1* | 8/2023 | Shin | H10H 20/857 |
| | | | | 257/79 |

* cited by examiner

DISPLAY DEVICE AND METHOD FOR FABRICATING THE SAME

CROSS-REFERENCE TO RELATED APPLICATION(S)

This application claims priority to and benefits of Korean Patent Application No. 10-2021-0181807 under 35 U.S.C. § 119, filed on Dec. 17, 2021, in the Korean Intellectual Property Office (KIPO), the entire contents of which are incorporated herein by reference.

BACKGROUND

1. Technical Field

The disclosure relates to a display device and a method for fabricating the same.

2. Description of the Related Art

The importance of display devices has steadily increased with the development of multimedia technology. In response thereto, various types of display devices such as an organic light emitting display (OLED), a liquid crystal display (LCD) and the like have been used.

As a device for displaying an image of a display device, there is a self-light emitting display device including a light emitting element. The self-light emitting display device may include an organic light emitting display device using an organic material as a light emitting material as a light emitting element, an inorganic light emitting display device using an inorganic material as a light emitting material, or the like.

SUMMARY

Aspects of the disclosure provide a display device capable of simplifying a fabricating process and a method for fabricating the same.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, the display device may comprise a via layer disposed on a substrate, a first electrode and a second electrode disposed on the via layer and spaced apart from each other, a first insulating layer disposed on the first electrode and the second electrode, light emitting elements disposed on the first insulating layer and disposed on the first electrode and the second electrode, a bank layer disposed on the first insulating layer and comprising a first opening in which the light emitting elements may be disposed and a second opening spaced apart from the first opening, a second insulating layer disposed on the light emitting elements, and a first contact electrode and a second contact electrode disposed on the bank layer, the light emitting elements, and the second insulating layer, and spaced apart from each other, the first contact electrode electrically contacting an end of each if the light emitting elements, the second contact electrode electrically contacting another end of each of the light emitting elements, wherein in the second opening, a thickness of the via layer overlapping the first insulating layer in a plan view may be greater than a thickness of the via layer that does not overlap the first insulating layer in a plan view.

In an embodiment, in the second opening, a side surface of the first insulating layer and a side surface of the via layer may be exposed, and a side surface of the first insulating layer and a side surface of the via layer may be aligned and coincide with each other.

In an embodiment, the bank layer may comprise a first barrier wall portion overlapping the first electrode in a plan view, a second barrier wall portion spaced apart from the first barrier wall portion, the first opening being disposed between the first barrier wall portion and the second barrier wall portion and overlapping the second electrode in a plan view, a bank portion surrounding the first barrier wall portion and the second barrier wall portion, and a sub-barrier wall portion surrounding the second opening.

In an embodiment, a thickness of the bank portion may be greater than a thickness of each of the first barrier wall portion and the second barrier wall portion, and the thickness of each of the first barrier wall portion and the second barrier wall portion may be greater than a thickness of the sub-barrier wall.

In an embodiment, a side surface of the sub-barrier wall portion of the bank layer may contact a top surface of the first insulating layer and is spaced apart from a side surface of the first insulating layer.

In an embodiment, the light emitting elements may be disposed between the first barrier wall portion and the second barrier wall portion.

In an embodiment, the first barrier wall portion, the second barrier wall portion, the bank portion, and the sub-barrier wall portion may be integral with each other.

In an embodiment, the display device may comprise an emission area overlapping the light emitting elements in a plan view, and a sub-region spaced apart from the emission area, the first opening is disposed in the emission area, and the second opening is disposed in the sub-region.

In an embodiment, a first contact portion and a second contact portion spaced apart from the first contact portion may be disposed in the sub-region, the first contact electrode may electrically contact the first electrode through the first contact portion penetrating the bank layer and the first insulating layer, and the second contact electrode may electrically contact the second electrode through the second contact portion penetrating the bank layer and the first insulating layer.

According to an embodiment of the disclosure, the method for fabricating a display device, may comprise forming a via layer on a substrate, forming a first electrode and a second electrode spaced apart from each other on the via layer, forming a first insulating layer on the first electrode and the second electrode, forming a bank layer comprising a protection portion by applying a bank material layer on the first insulating layer and using a mask, patterning the first insulating layer by using the bank layer as a mask, forming a first opening by performing an ashing process on the bank layer to remove the protection portion, forming light emitting elements on the first insulating layer in the first opening, forming a second insulating layer on the light emitting elements, and forming a first contact electrode and a second contact electrode disposed on the light emitting elements and spaced apart from each other, the first contact electrode electrically contacting an end of each of the light emitting elements, the second contact electrode electrically contacting another end of each of the light emitting elements.

In an embodiment, the mask may comprise a transmission area, a blocking area, a first semi-transmission area, and a second semi-transmission area, and an amount of transmitted light may be greater in the second semi-transmission area than in the first semi-transmission area.

In an embodiment, in the bank layer, a region corresponding to the transmission area may be removed, a bank portion may be formed in a region corresponding to the blocking area, barrier wall portions may be formed in a region corresponding to the first semi-transmission area, and a sub-barrier wall portion and the protection portion may be formed in a region corresponding to the second semi-transmission area.

In an embodiment, a thickness of the bank portion may be greater than a thickness of each of the barrier wall portions, and the thickness of each of the barrier wall portions may be greater than a thickness of the sub-barrier wall portion.

In an embodiment, a second opening may be formed in the forming of the bank layer, and a portion of a surface of the via layer in the second opening may be removed in the removing of the protection portion.

In an embodiment, in the second opening, a side surface of the first insulating layer and a side surface of the via layer may be aligned and coincide with each other.

According to an embodiment of the disclosure, the method for fabricating a display device, may comprise forming a via layer on a substrate, forming a first electrode and a second electrode spaced apart from each other on the via layer, forming a first insulating layer on the first electrode and the second electrode, forming a bank layer comprising a protection portion by applying a bank material layer on the first insulating layer and using a mask, patterning the first insulating layer using the bank layer as a mask and removing the protection portion, forming light emitting elements on the first insulating layer, forming a second insulating layer on the light emitting elements, and forming a first contact electrode and a second contact electrode disposed on the light emitting elements and spaced apart from each other, the first contact electrode electrically contacting an end of each of the light emitting elements, the second contact electrode electrically contacting another end of each of the light emitting elements.

In an embodiment, the patterning of the first insulating layer and the removing of the protection portion may be performed by a dry etching process.

In an embodiment, as the protection portion is removed, a portion of an exposed surface of the first insulating layer may be etched so that a thickness of the first insulating layer is reduced.

In an embodiment, the protection portion may be removed to form a first opening of the bank layer, and the light emitting elements may be formed on the first opening.

In an embodiment, in the forming of the bank layer using the mask, a second opening exposing the first insulating layer may be formed, and a side surface of the bank layer and a side surface of the first insulating layer may be aligned and coincide with each other in the second opening.

According to the display device and the method for fabricating the same according to the embodiments, it is possible to reduce fabricating costs and improve productivity by reducing the number of masks in the process for forming a bank layer and a first insulating layer.

However, the effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
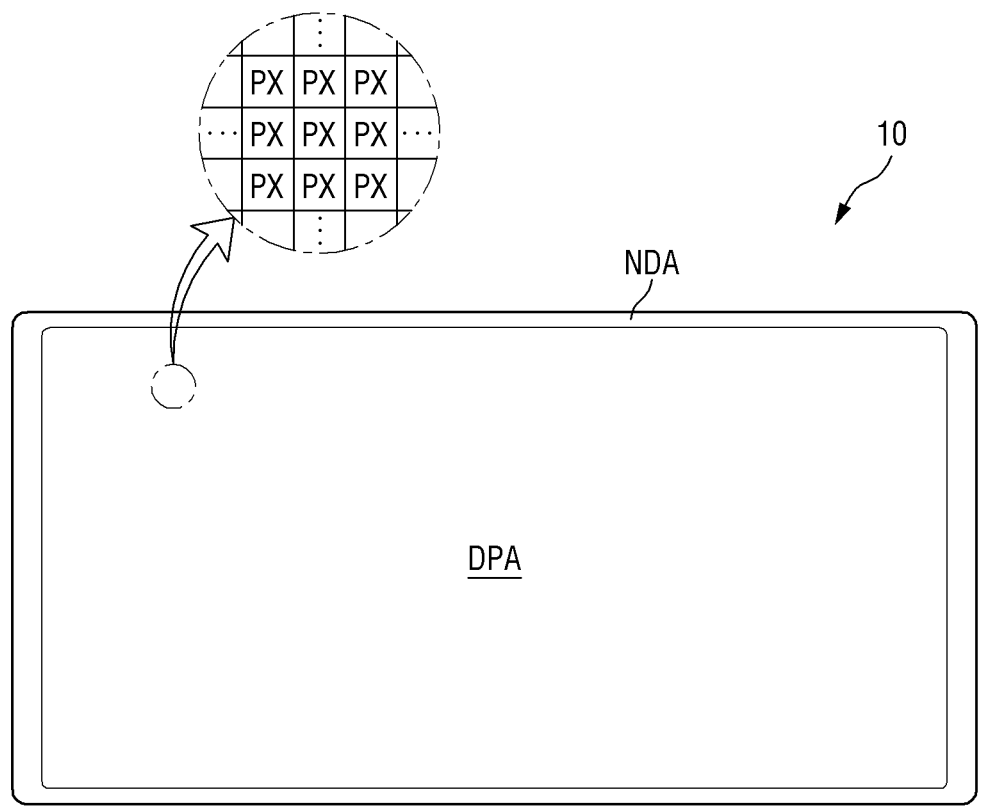
FIG. 1 is a schematic plan view of a display device according to an embodiment.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be more thorough and complete, and will convey the scope of the disclosure to those skilled in the art.

It will also be understood that in case that a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The term "overlap" or "at least partially overlap" as used herein may mean that at least part of a first object faces at least part of a second object in a given direction or given view.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above"

the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The term "and/or" includes all combinations of one or more of which associated configurations may define. For example, "A and/or B" may be understood to mean "A, B, or A and B."

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Each of the features of the various embodiments of the disclosure may be combined or combined with each other, in part or in whole, and technically various interlocking and driving are possible. Each embodiment may be implemented independently of each other or may be implemented together in an association.

Hereinafter, embodiments will be described in detail with reference to the accompanying drawings.

FIG. 1 is a schematic plan view of a display device according to one embodiment.

Referring to FIG. 1, a display device 10 may display a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 may include a display panel which provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel may be applied as a display panel will be described as an example, but the disclosure is not limited thereto, and other display panels may be applied within the same scope of technical spirit.

The shape of the display device 10 may be variously changed. For example, the display device 10 may have a shape such as a rectangular shape elongated in a horizontal direction, a rectangular shape elongated in a vertical direction, a square shape, a quadrilateral shape with rounded corners (vertices), another polygonal shape or a circular shape. The shape of a display area DPA of the display device 10 may also be similar to the overall shape of the display device 10. FIG. 1 illustrates the display device 10 having a rectangular shape elongated in a second direction DR2.

The display device 10 may include the display area DPA and a non-display area NDA. The display area DPA may be an area where a screen can be displayed, and the non-display area NDA may be an area where a screen is not displayed. The display area DPA may also be referred to as an active region, and the non-display area NDA may also be referred to as a non-active region. The display area DPA may substantially occupy the center of the display device 10.

The display area DPA may include pixels PX. The pixels PX may be arranged in a matrix. The shape of each pixel PX may be a rectangular or square shape in a plan view. However, the disclosure is not limited thereto, and it may be a rhombic shape in which each side is inclined with respect to a direction. The pixels PX may be arranged in a stripe type or an island type. Each of the pixels PX may include one or more light emitting elements that emit light of a specific wavelength band to display a specific color.

The non-display area NDA may be disposed around (or adjacent to) the display area DPA. The non-display area NDA may completely or partially surround the display area DPA. The display area DPA may have a rectangular shape, and the non-display area NDA may be disposed adjacent to four sides of the display area DPA. The non-display area NDA may comprise a bezel of the display device 10. Wires or circuit drivers included in the display device 10 may be disposed in the non-display area NDA, or external devices may be mounted thereon.

Figure 2:
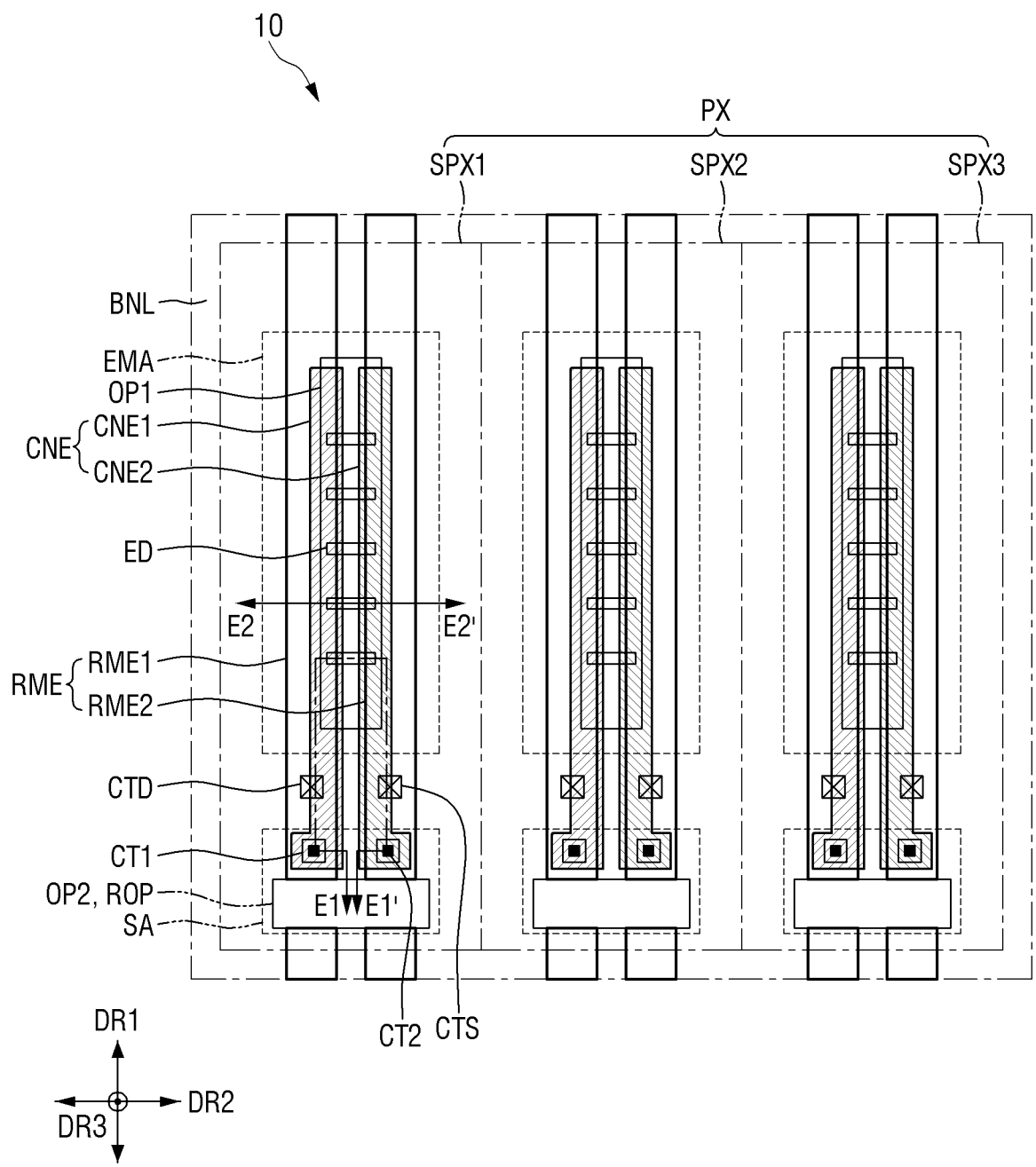
FIG. 2 is a schematic plan view illustrating one pixel of a display device according to an embodiment.

FIG. 2 is a schematic plan view illustrating one pixel of a display device according to an embodiment.

FIG. 2 shows the planar arrangement of electrodes RME (RME1 and RME2), a bank layer BNL, light emitting elements ED and contact electrodes CNE (CNE1 and CNE2) disposed in a pixel PX of the display device 10.

Referring to FIG. 2, each of the pixels PX of the display device 10 may include sub-pixels SPXn. For example, a pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, the disclosure is not limited thereto, and the sub-pixels SPXn may emit light of the same color. In an embodiment, each of the sub-pixels SPXn may emit blue light. Although it is illustrated in the drawing that one pixel PX includes three sub-pixels SPXn, the disclosure is not limited thereto, and the pixel PX may include a larger number of sub-pixels SPXn.

Each sub-pixel SPXn of the display device 10 may include an emission area EMA and a non-emission area. The emission area EMA may be an area in which the light emitting element ED is disposed to emit light of a specific wavelength band. The non-emission area may be a region in which the light emitting element ED is not disposed and a region from which light is not emitted because light emitted from the light emitting element ED does not reach it. The emission area EMA may include the area in which the light emitting element ED is disposed, and a region adjacent to the light emitting element ED in which the lights emitted from the light emitting element ED are emitted. For example, the emission area EMA may further include a region in which the light emitted from the light emitting element ED is reflected or refracted by another member and emitted. The light emitting elements ED may be disposed in each sub-pixel SPXn, and the emission area may be formed to include an area where the light emitting elements ED are disposed and an area adjacent thereto.

Although it is shown in the drawing that the sub-pixels SPXn have the emission areas EMA that are substantially identical in size, the disclosure is not limited thereto. In some embodiments, the emission areas EMA of the sub-pixels SPXn may have different sizes according to a color or wavelength band of light emitted from the light emitting element ED disposed in each sub-pixel.

Each sub-pixel SPXn may further include a sub-region SA disposed in the non-emission area. The sub-region SA of the corresponding sub-pixel SPXn may be disposed on the lower side of the emission area EMA, which is the other side in a first direction DR1. The emission area EMA and the sub-region SA may be alternately arranged in the first direction DR1, and the sub-region SA may be disposed between the emission areas EMA of different sub-pixels SPXn spaced apart from each other in the first direction DR1. For example, the emission area EMA and the sub-region SA may be alternately arranged in the first direction DR1, and each of the emission area EMA and the sub-region SA may be repeatedly arranged in the second direction DR2. However, the disclosure is not limited thereto, and the arrangement of the emission areas EMA and the sub-regions SA in the pixels PX may be different from the arrangement shown in FIG. 2. A third direction DR3 may be a thickness direction.

Light may not be emitted from the sub-region SA because the light emitting element ED is not disposed in the sub-region SA, but an electrode RME disposed in each sub-pixel SPXn may be partially disposed in the sub-region SA. The electrodes RME disposed in different sub-pixels SPXn may be disposed to be separated at a separation portion ROP of the sub-region SA.

The display device 10 may include the electrodes RME (RME1 and RME2), the bank layer BNL, the light emitting elements ED and the contact electrodes CNE (CNE1 and CNE2). The electrodes RME (RME1 and RME2) have a shape extending in a direction and are disposed in each sub-pixel SPXn. The electrodes RME1 and RME2 may extend in the first direction DR1 and may be disposed in the emission area EMA and the sub-region SA of the sub-pixels SPXn, and may be disposed to be spaced apart from each other in the second direction DR2. The electrodes RME may be electrically connected to the light emitting element ED to be described below, but the disclosure is not limited thereto. The electrodes RME may not be electrically connected to the light emitting elements ED.

The display device 10 may include the first electrode RME1 and the second electrode RME2 arranged in each sub-pixel SPXn. The first electrode RME1 may be located on the left side from the center of the emission area EMA, and the second electrode RME2 may be located on the right side with respect to the center of the emission area EMA while being spaced apart from the first electrode RME1 in the second direction DR2. The first electrode RME1 and the second electrode RME2 disposed in different sub-pixels SPXn may be separated from each other with respect to the separation portion ROP located in the sub-region SA of a sub-pixel SPXn.

Although it is illustrated in the drawing that two electrodes RME have a shape extending in the first direction DR1 in each sub-pixel SPXn, the disclosure is not limited thereto. For example, the display device 10 may have a shape in which a larger number of electrodes RME are disposed in a sub-pixel SPXn or the electrodes RME may be partially bent and have different widths depending on positions.

The bank layer BNL may be disposed across the entire display area DPA and may partially expose or surround the sub-pixels SPXn. For example, the bank layer BNL may surround a first opening OP1 disposed in the emission area EMA of the sub-pixel SPXn and a second opening OP2 of the sub-region SA disposed on a side of the emission area EMA. As another example, the bank layer BNL may include the first opening OP1 disposed on the entire surface of the display area DPA to expose a portion of the emission area EMA of the sub-pixel SPXn and the second opening OP2 exposing a portion of the sub-region SA.

As will be described below, the bank layer BNL may include a bank portion ('BNP' of FIG. 3), barrier walls ('BP1' and 'BP2' of FIG. 3) having a lower height than the bank portion BNP, and a sub-barrier wall portion ('SBP' of FIG. 3). The bank portion BNP may be disposed at the boundary between the sub-pixels SPXn adjacent in the first direction DR1 and the second direction DR2, and may also be disposed at the boundary between the emission area EMA and the sub-region SA. The sub-pixels SPXn, the emission area EMA, and the sub-region SA of the display device 10 may be the areas distinguished by the arrangement of the bank portion BNP. The gaps between the sub-pixels or SPXn, the emission areas EMA and the sub-regions SA may vary depending on the width of the bank portion BNP. The bank portion BNP may overlap the electrodes RME1 and RME2 at the boundary of the sub-pixel SPXn and between the emission area EMA and the sub-region SA.

The barrier walls BP1 and BP2 of the bank layer BNL may be integrated with (or may be integral with) the bank portion BNP to be disposed in the emission area EMA of each sub-pixel SPXn. The barrier walls BP1 and BP2 may be spaced apart from each other with the first opening OP1 interposed therebetween. The light emitting elements ED may be disposed in the first opening OP1 formed by the barrier walls BP1 and BP2. The barrier walls BP1 and BP2 may overlap the electrodes RME1 and RME2, respectively, in the emission area EMA of the sub-pixel SPXn.

The sub-barrier wall portion SBP1 of the bank layer BNL may be integrated with the bank portion BNP and the barrier walls BP1 and BP2 to be disposed in the sub-region SA of each sub-pixel SPXn. The sub-barrier wall portion SBP1 may be a portion surrounding the second opening OP2 disposed in the sub-region SA. The second opening OP2 formed by the sub-barrier wall portion SBP1 may be the same as the separation portion ROP, and the electrodes RME, a first insulating layer ('PAS1' of FIG. 3) and the contact electrodes CNE may be not disposed. The top surface of a via layer ('VIA' of FIG. 3) may be exposed through the second opening OP2.

The light emitting elements ED may be arranged in the emission area EMA. The light emitting elements ED may be disposed in the first opening OP1 of the bank layer BNL and may be disposed to be spaced apart from each other in the first direction DR1. In an embodiment, the light emitting elements ED may have a shape extending in a direction, and both ends thereof may be disposed on different electrodes RME. For example, the light emitting element ED may be disposed such that the first end is disposed on the first electrode RME1 and the second end is disposed on the second electrode RME2. The length of the light emitting element ED may be greater than the gap between the electrodes RME spaced apart from each other in the second direction DR2. The extension direction of the light emitting elements ED may be substantially perpendicular to the first direction DR1 in which the electrodes RME extend. However, the disclosure is not limited thereto, and the light emitting element ED may extend in the second direction DR2 or in a direction oblique to the second direction DR2.

The contact electrodes CNE may be disposed on the light emitting element ED, a second insulating layer ('PAS2' of FIG. 3) and the bank layer BNL. The contact electrodes CNE may have a shape extending in a direction, and may be disposed to be spaced apart from each other. Each of the contact electrodes CNE may be in electrical contact with the light emitting element ED, and may be electrically connected to the electrodes RME.

The contact electrodes CNE may include a first contact electrode CNE1 and a second contact electrode CNE2 disposed in each sub-pixel SPXn. The first contact electrode CNE1 may have a shape extending in the first direction DR1 and may be disposed on the first electrode RME1. The first contact electrode CNE1 may partially overlap the first electrode RME1 and may be disposed from the emission area EMA to the sub-region SA. The second contact electrode CNE2 may have a shape extending in the first direction DR1 and may be disposed on the second electrode RME2. The second contact electrode CNE2 may partially overlap the second electrode RME2 and may be disposed from the emission area EMA to the sub-region SA. The first contact electrode CNE1 may be in electrical contact with the first end of the light emitting element ED and the second contact electrode CNE2 may be in electrical contact with the second end of the light emitting element ED.

In accordance with an embodiment, in the display device 10, the contact electrodes CNE may be in electrical contact with the electrode RME through the contact portions CT1 and CT2 disposed in the sub-region SA. The first contact electrode CNE1 may be in electrical contact with the first electrode RME1 through the first contact portion CT1 in the sub-region SA. The second contact electrode CNE2 may be in electrical contact with the second electrode RME2 through the second contact portion CT2 in the sub-region SA. The contact electrodes CNE may each receive a power voltage through the electrodes RME. The first contact electrode CNE1 may receive a first power voltage through the first electrode RME1, and the second contact electrode CNE2 may receive a second power voltage through the second electrode RME2. Each contact electrode CNE may be in electrical contact with the light emitting element ED in the emission area EMA to transmit the power voltage to the light emitting element ED.

Figure 3:
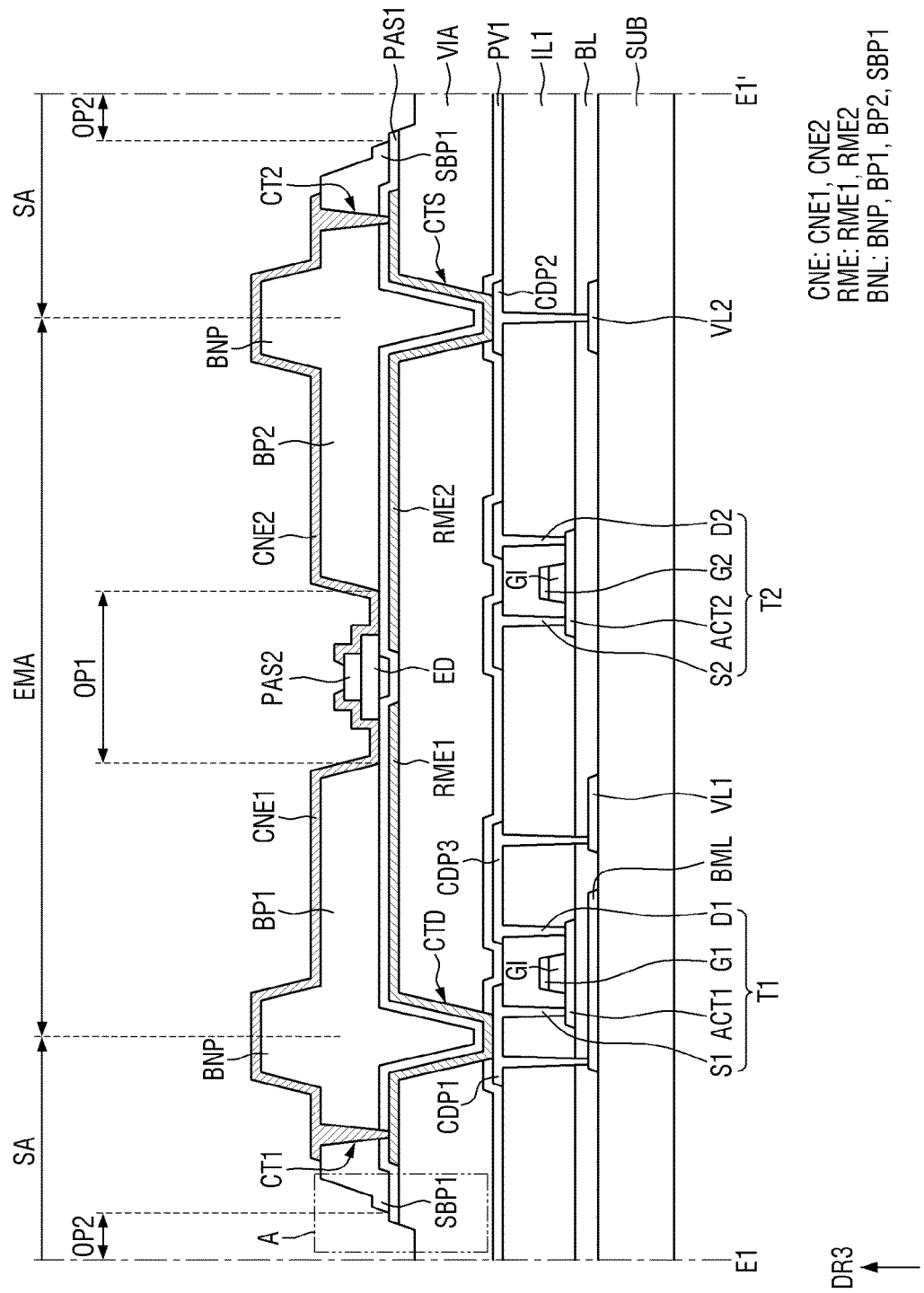
FIG. 3 is a schematic cross-sectional view taken along line E1-E1' of FIG. 2.
Figure 4:
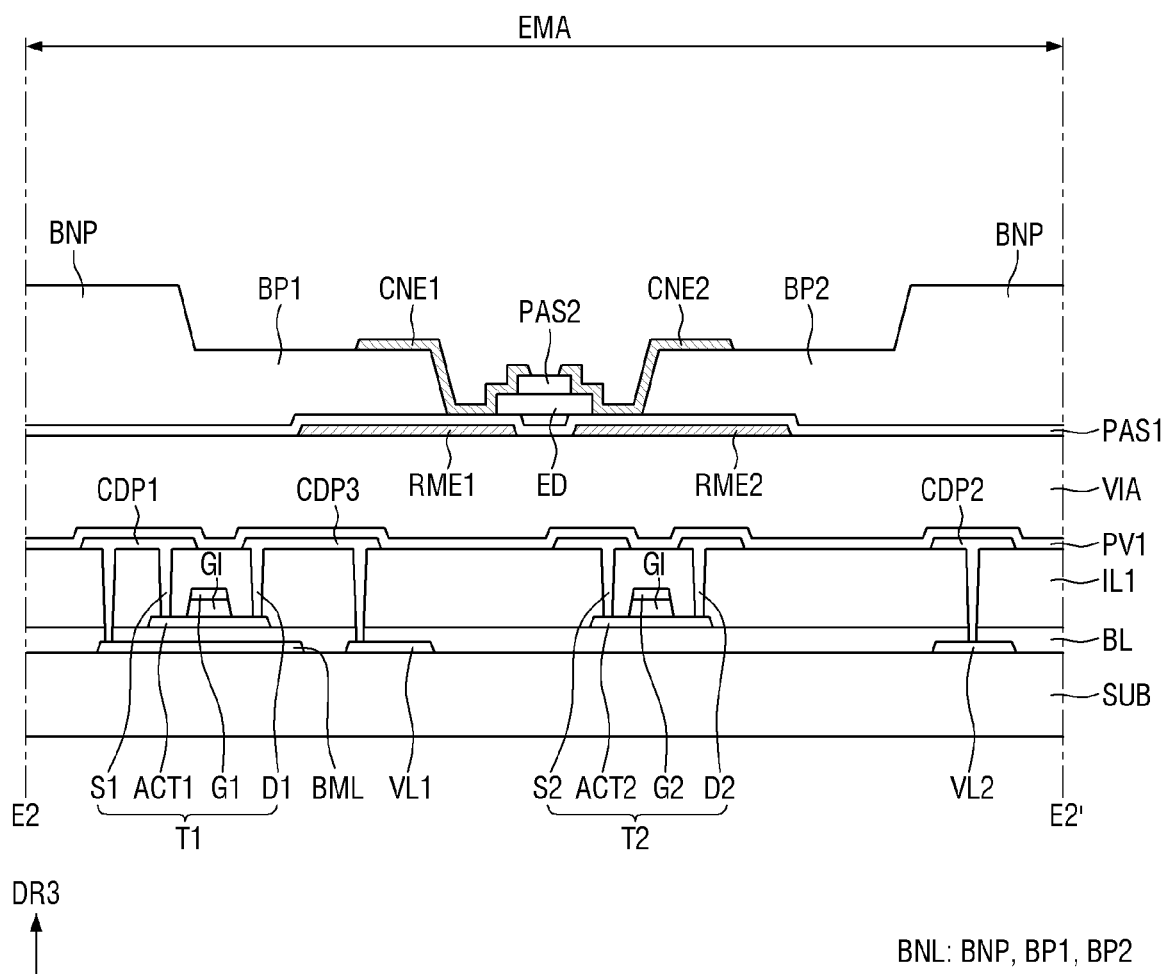
FIG. 4 is a schematic cross-sectional view taken along line E2-E2' of FIG. 2.
Figure 5:
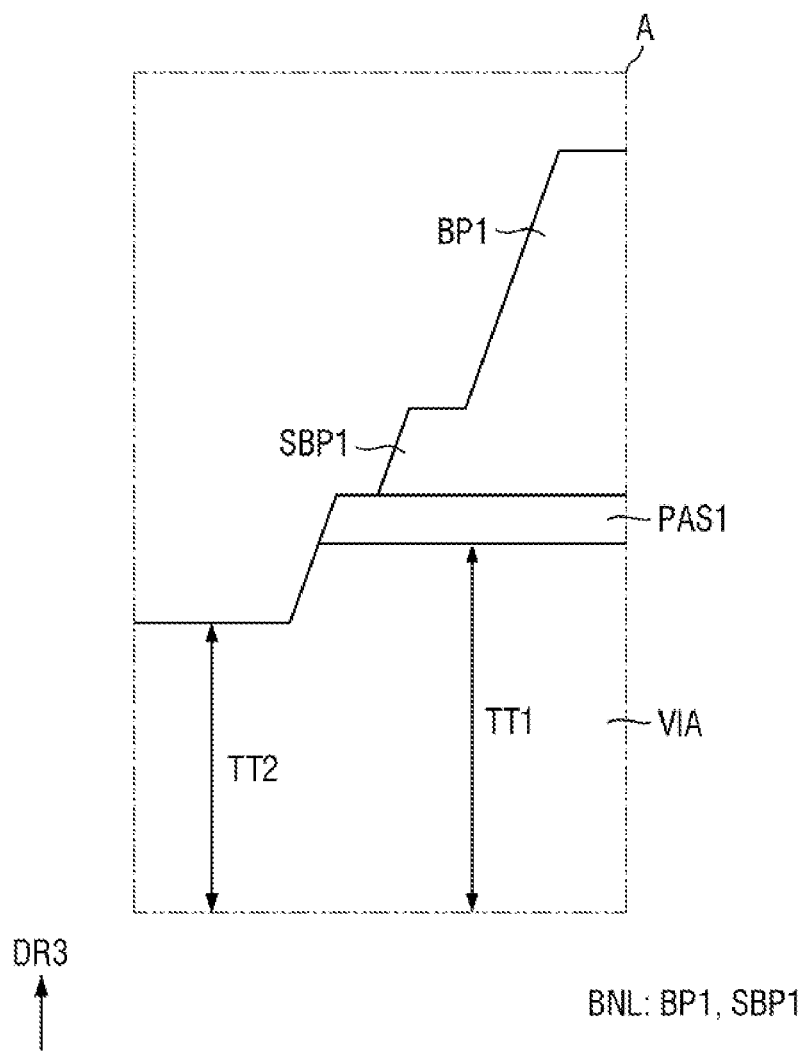
FIG. 5 is a schematic enlarged view of area A of FIG. 3.

FIG. 3 is a schematic cross-sectional view taken along line E1-E1' of FIG. 2. FIG. 4 is a schematic cross-sectional view taken along line E2-E2' of FIG. 2. FIG. 5 is a schematic enlarged view of area A of FIG. 3.

FIG. 3 illustrates a cross section across electrode contact holes CTD and CTS, contact portions CT1 and CT2, and both ends of the light emitting elements ED disposed in the first sub-pixel SPX1. FIG. 4 illustrates a cross section across a portion of the bank layer BNL and both ends of the light emitting elements ED disposed in the first sub-pixel SPX1.

Referring to FIGS. 3 to 5 in conjunction with FIG. 2, the display device 10 may include a substrate SUB and a semiconductor layer, conductive layers and insulating layers disposed on the substrate SUB. The display device 10 may include the electrodes RME (RME1 and RME2), the light emitting elements ED and contact electrodes CNE (CNE1 and CNE2).

The substrate SUB may be an insulating substrate. The substrate SUB may be made of an insulating material such as glass, quartz, or polymer resin. Further, the substrate SUB may be a rigid substrate, but may also be a flexible substrate which can be bent, folded or rolled. The substrate SUB may include the display area DPA (see FIG. 1) and the non-display area NDA (see FIG. 1) surrounding the display area DPA, and the display area DPA may include the emission area EMA and the sub-region SA that is a portion of the non-emission area.

A first conductive layer may be disposed on the substrate SUB. The first conductive layer may include a lower metal layer BML, a first voltage line VL1 and a second voltage line VL2. The lower metal layer BML may be arranged to overlap an active layer ACT1 of a first transistor T1. The lower metal layer BML may prevent light from entering the first active layer ACT1 of the first transistor T1, or may be electrically connected to the first active layer ACT1 to stabilize electrical characteristics of the first transistor T1. However, the lower metal layer BML may be omitted.

The first voltage line VL1 may be applied with a high potential voltage (or a first power voltage) transmitted to a first electrode RME1, and the second voltage line VL2 may be applied with a low potential voltage (or a second power voltage) transmitted to a second electrode RME2. The first voltage line VL1 may be electrically connected to the first the first transistor T1 through a conductive pattern (e.g., a third conductive pattern CDP) of a third conductive layer. The second voltage line VL2 may be electrically connected to the second electrode RME2 through a conductive pattern (e.g., a second conductive pattern CDP) of a third conductive layer.

Although it is illustrated in the drawing that the first voltage line VL1 and the second voltage line VL2 are disposed on the first conductive layer, the disclosure is not limited thereto. In some embodiments, the first voltage line VL1 and the second voltage line VL2 may be disposed on the third conductive layer and electrically connected directly to the first transistor T1 and the second electrode RME2, respectively.

A buffer layer BL may be disposed on the first conductive layer and the substrate SUB. The buffer layer BL may be formed on the substrate SUB to protect the transistors of the pixel PX from moisture permeating through the substrate SUB susceptible to moisture permeation, and may perform a surface planarization function.

The semiconductor layer may be disposed on the buffer layer BL. The semiconductor layer may include the first active layer ACT1 of the first transistor T1 and a second active layer ACT2 of the second transistor T2. The first active layer ACT1 and the second active layer ACT2 may be disposed to partially overlap a first gate electrode G1 and a second gate electrode G2 of a second conductive layer to be described below, respectively.

The semiconductor layer may include polycrystalline silicon, monocrystalline silicon, oxide semiconductor, and the like. In another embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

Although it is illustrated in the drawing that one first transistor T1 and one second transistor T2 are disposed in the sub-pixel SPXn of the display device 10, the disclosure is not limited thereto and the display device 10 may include a larger number of transistors.

A gate insulating layer G1 may be disposed on the semiconductor layer in the display area DPA. The gate insulating layer G1 may serve as a gate insulating layer of each of the transistors T1 and T2. Although it is illustrated in the drawing that the gate insulating layer G1 is patterned together with the gate electrodes G1 and G2 of the second conductive layer to be described below and partially disposed between the second conductive layer and the active layers ACT1 and ACT2 of the semiconductor layer, the disclosure is not limited thereto. In some embodiments, the gate insulating layer G1 may be entirely disposed on the buffer layer BL.

The second conductive layer may be disposed on the gate insulating layer G1. The second conductive layer may include a first gate electrode G1 of the first transistor T1 and a second gate electrode G2 of the second transistor T2. The first gate electrode G1 may be disposed to overlap the channel region of the first active layer ACT1 in a third direction DR3 that is a thickness direction, and the second gate electrode G2 may be disposed to overlap the channel region of the second active layer ACT2 in the third direction DR3 that is the thickness direction. Although not shown in the drawing, the second conductive layer may further include one electrode of the storage capacitor.

An interlayer insulating layer IL1 may be disposed on the second conductive layer. The interlayer insulating layer IL1 may function as an insulating film between the second conductive layer and other layers disposed thereon, and may protect the second conductive layer.

A third conductive layer may be disposed on the interlayer insulating layer IL1. The third conductive layer may include conductive patterns CDP1, CDP2 and CDP3, and source electrodes S1 and S2 and drain electrodes D1 and D2 of the respective transistors T1 and T2. Some of the conductive patterns CDP1, CDP2 and CDP3 may electrically connect the conductive layers or the semiconductor layers of different layers to each other and serve as source/drain electrodes of the transistors T1 and T2.

The first conductive pattern CDP1 may be in electrical contact with the first active layer ACT1 of the first transistor T1 through the contact hole penetrating the interlayer insulating layer IL1. The first conductive pattern CDP1 may be in electrical contact with the lower metal layer BML through a contact hole penetrating the interlayer insulating layer IL1 and the buffer layer BL. The first conductive pattern CDP1 may serve as a first source electrode S1 of the first transistor T1. The first conductive pattern CDP1 may be electrically connected to the first electrode RME1 or the first contact electrode CNE1. The first transistor T1 may transmit the first power voltage applied from the first voltage line VL1 to the first electrode RME1 or the first contact electrode CNE1.

The second conductive pattern CDP2 may be in electrical contact with the second voltage line VL2 through a contact hole penetrating the interlayer insulating layer IL1 and the buffer layer BL. The second conductive pattern CDP2 may be electrically connected to the first electrode RME1 or the first contact electrode CNE1. The second voltage line VL2 may transmit a second power voltage to the second electrode RME2 or the second contact electrode CNE2.

The third conductive pattern CDP3 may be in electrical contact with the first power voltage line VL1 through a contact hole penetrating the interlayer insulating layer IL1 and the buffer layer BL. Further, the third conductive pattern CDP3 may be in electrical contact with the first active layer ACT1 of the first transistor T1 through the contact hole penetrating the interlayer insulating layer IL1. The third conductive pattern CDP3 may electrically connect the first voltage line VL1 to the first transistor T1 and serve as a first drain electrode D1 of the first transistor T1.

The second source electrode S2 and the second drain electrode D2 may be in electrical contact with the second active layer ACT2 of the second transistor T2 through the contact holes penetrating the interlayer insulating layer IL1. The second transistor T2 may transmit a data signal to the first transistor T1 or transmit an initialization signal.

A passivation layer PV1 may be disposed on the third conductive layer. The passivation layer PV1 may function as an insulating layer between the third conductive layer and other layers and may protect the third conductive layer.

The buffer layer BL, the gate insulating layer G1, the interlayer insulating layer IL1, and the passivation layer PV1 described above may be formed of inorganic layers stacked in an alternating manner. For example, the buffer layer BL, the gate insulating layer G1, the interlayer insulating layer IL1, and the passivation layer PV1 may be formed as a double layer formed by stacking, or a multilayer formed by alternately stacking, inorganic layers including at least one of silicon oxide ($SiO_x$), silicon nitride ($SiN_x$), or silicon oxynitride ($SiO_xN_y$). However, the disclosure is not limited thereto, and the buffer layer BL, the gate insulating layer G1, the interlayer insulating layer IL1, and the passivation layer PV1 may be formed as a single inorganic layer containing the above-described insulating material. Further, in some embodiments, the interlayer insulating layer IL1 may be made of an organic insulating material such as polyimide (PI) or the like.

A via layer VIA may be disposed on the third conductive layer in the display area DPA. The via layer VIA may contain an organic insulating material, e.g., polyimide (PI), and may compensate the stepped portion formed by the conductive layers disposed thereunder to flatten the top surface. However, in some embodiments, the via layer VIA may be omitted.

As a display element layer disposed on the via layer VIA, the display device 10 may include electrodes RME (RME1 and RME2), the bank layer BNL, the light emitting element ED and the contact electrodes CNE. The display device 10 may include a first insulating layer PAS1 and a second insulating layer PAS2 disposed on the via layer VIA.

Electrodes RME may be disposed on the via layer VIA. For example, the electrodes RME may be disposed directly on the via layer VIA and be spaced apart from each other to face each other. The first electrode RME1 and the second electrode RME2 may overlap the bank portion BNP and the barrier walls BP1 and BP2 of the bank layer BNL to be described below, respectively. The first electrode RME1 may overlap the bank portion BNP and the first barrier wall portion BP1, and the second electrode RME2 may overlap the bank portion BNP and the second barrier wall portion BP2. The first electrode RME1 and the second electrode RME2 may be disposed to be spaced apart from each other, and the space therebetween may overlap the first opening OP1 of the bank layer BNL. In an embodiment, the space between the first electrode RME1 and the second electrode RME2 may be smaller than a width of the first opening OP1 of the bank layer BNL or the space between the first barrier wall portion BP1 and the second barrier wall portion BP2. The first opening OP1 may have a width sufficient to allow the light emitting element ED to be disposed, and the first electrode RME1 and the second electrode RME2 may be spaced apart from each other enough for both ends of the light emitting element ED to be placed therebetween.

The electrodes RME may be in contact (e.g., direct contact) with the third conductive layer through the electrode contact holes CTD and CTS at the portions overlapping the bank layer BNL between the emission area EMA and the sub-region SA. The first electrode contact hole CTD may be formed in an area in which the bank layer BNL and the first electrode RME1 overlap, and the second electrode contact hole CTS may be formed in an area in which the bank layer BNL and the second electrode RME2 overlap. The first electrode RME1 may be in electrical contact with the first conductive pattern CDP1 through the first electrode contact hole CTD penetrating the via layer VIA and the passivation layer PV1. The second electrode RME2 may be in electrical contact with the second conductive pattern CDP2 through the second electrode contact hole CTS penetrating the via layer VIA and the passivation layer PV1. The first electrode RME1 may be electrically connected to the first transistor T1 through the first conductive pattern CDP1 and may receive the first power voltage. The second electrode RME2 may be electrically connected to the second voltage line VL2 through the second conductive pattern CDP2 and may receive the second power voltage. However, the disclosure is not limited thereto. In another embodiment, the electrodes RME1 and RME2 may not be electrically connected to the conductive patterns CDP1 and CDP2 of the third conductive layer, respectively, and the contact electrodes CNE to be described below may be directly connected to the third conductive layer.

The electrodes RME may include a conductive material having high reflectivity. For example, the electrodes RME may contain a metal such as silver (Ag), copper (Cu), or aluminum (Al), or may contain an alloy including aluminum (Al), nickel (Ni), lanthanum (La), or the like. As another example, the electrodes RME may have a structure in which a metal layer such as titanium (Ti), molybdenum (Mo), and niobium (Nb) and the alloy are stacked. In some embodiments, the electrodes RME may be formed as a double layer or a multilayer formed by stacking at least one metal layer made of an alloy including aluminum (Al) and titanium (Ti), molybdenum (Mo), and niobium (Nb).

The disclosure is not limited thereto, and each electrode RME may further include a transparent conductive material. For example, each electrode RME may include a material such as ITO, IZO, and ITZO. In some embodiments, each of the electrodes RME may have a structure in which at least one transparent conductive material and at least one metal layer having high reflectivity are stacked, or may be formed as one layer including them. For example, each electrode RME may have a stacked structure of ITO/Ag/ITO, ITO/Ag/IZO, ITO/Ag/ITZO/IZO, or the like. The electrodes RME may be electrically connected to the light emitting element ED, and may reflect some of the lights emitted from the light emitting element ED in an upward direction of the substrate SUB.

The first insulating layer PAS1 may be disposed in the entire display area DPA and may be disposed on the via layer VIA and the electrodes RME. The first insulating layer PAS1 may be disposed under the light emitting element ED to be described below to cover the electrodes RME. The first insulating layer PAS1 may include an insulating material to protect the electrodes RME and insulate electrodes RME different from each other. The first insulating layer PAS1 may be disposed to cover the electrodes RME before the bank layer BNL may be formed, so that it is possible to prevent the electrodes RME from being damaged in a process of forming the bank layer BNL. The first insulating layer PAS1 may prevent the light emitting element ED disposed thereon from being damaged by contact (e.g., direct contact) with other members.

In an embodiment, the first insulating layer PAS1 may have stepped portions such that the top surface thereof may be partially depressed between the electrodes RME spaced apart in the second direction DR2. The light emitting element ED may be disposed on the top surface of the first insulating layer PAS1, where the stepped portions are formed, and thus a space may remain between the light emitting element ED and the first insulating layer PAS1.

The bank layer BNL may be disposed on the first insulating layer PAS1. The bank layer BNL may include the bank portion BNP, the barrier walls BP1 and BP2 having a height different from the bank portion BNP and the sub-barrier wall portion SBP1 having a height different from the bank portion BNP and the barrier walls BP1 and BP2, and each of them may be disposed in the emission area EMA of the sub-pixel SPXn or at the boundary of the sub-pixel SPXn. The sub-barrier wall portion SBP1, the barrier walls BP1 and BP2 and the bank portion BNP may be integrated with each other, and they may be designated as parts of the bank layer BNL according to an arranged position and height.

The barrier walls BP1 and BP2 of the bank layer BNL may be disposed in the emission area EMA of each sub-pixel SPXn. The barrier walls BP1 and BP2 may have a shape extending in the first direction DR1 and be spaced apart from each other with the first opening OP1 disposed in the emission area EMA therebetween. For example, the barrier walls BP1 and BP2 may include the first barrier wall portion BP1 and the second barrier wall portion BP2 spaced apart from each other in the second direction DR2 with respect to the first opening OP1. The first barrier wall portion BP1 may be disposed on the left side with respect to the center of the emission area EMA, which is a side in the second direction DR2, and the second barrier wall portion BP2 may be disposed on the right side with respect to the center of the emission area EMA, which is the other side in the second direction DR2, while being spaced apart from the first barrier wall portion BP1. The bank portion BNP may be disposed between the first barrier wall portion BP1 and the second barrier wall portion BP2 of different sub-pixels SPXn. Light emitting elements ED may be disposed in the first opening OP1 between the first barrier wall portion BP1 and the second barrier wall portion BP2.

The first barrier wall portion BP1 and the second barrier wall portion BP2 may extend in the first direction DR1 to be integrated with the portion of the bank portion BNP of the bank layer BNL surrounding the emission area EMA. The length of each of the barrier walls BP1 and BP2 in the first direction DR1 may be the same as the length of the emission area EMA in the first direction DR1. The first barrier wall portion BP1 and the second barrier wall portion BP2 may also be disposed in the sub-region SA. The first barrier wall portion BP1 may be disposed to overlap the first contact portion CT1 of the sub-region SA, and the second barrier wall portion BP2 may be disposed to overlap the second contact portion CT2 of the sub-region SA. The first barrier wall portion BP1 of the sub-region SA may be disposed to be spaced apart from the first barrier wall portion BP1 of the emission area EMA with the bank portion BNP interposed therebetween. The second barrier wall portion BP2 of the sub-region SA may be disposed to be spaced apart from the second barrier wall portion BP2 of the emission area EMA with the bank portion BNP interposed therebetween.

The first barrier wall portion BP1 and the second barrier wall portion BP2 may have the same width in the second direction DR2. However, the disclosure is not limited thereto, and they may have different widths. For example, one barrier wall may have a greater width than the other barrier wall. Although it is illustrated in the drawing that two barrier walls BP1 and BP2 having the same width are disposed in the sub-pixel SPXn, the disclosure is not limited thereto. The number and the shape of the barrier walls BP1 and BP2 may vary depending on the number or the arrangement structure of the electrodes RME.

The barrier walls BP1 and BP2 may be disposed on the first insulating layer PAS1. For example, each of the barrier walls BP1 and BP2 may be directly disposed on the first insulating layer PAS1, and may have a structure in which at least a part thereof protrudes from the top surface of the first insulating layer PAS1. The protruding portion of the barrier walls BP1 and BP2 may have a side surface inclined or curved with a predetermined curvature. Unlike the example illustrated in the drawing, the barrier walls BP1 and BP2 may have a shape, e.g., a semicircular or semi-elliptical shape, in which the outer surface is curved with a certain curvature in cross-sectional view.

The bank portion BNP of the bank layer BNL may be disposed on the first insulating layer PAS1. The bank portion BNP may include portions extending in the first direction DR1 and the second direction DR2, and may surround the sub-pixels SPXn. The bank portion BNP may surround and distinguish the emission area EMA and the sub-region SA of each sub-pixel SPXn, and be integrated with the barrier walls BP1 and BP2 disposed in the emission area EMA and the sub-barrier wall portion SBP1 disposed in the sub-region SA. The bank portion BNP of the bank layer BNL may surround the outermost portion of the display area DPA and distinguish the display area DPA and the non-display area NDA. The bank layer BNL may be disposed in the entire display area DPA to form a grid pattern, and the regions exposed by the bank layer BNL in the display area DPA may be the first opening OP1 disposed in the emission area EMA and the second opening OP2 disposed in the sub-region SA. The portion of the bank layer BNL in which the barrier walls BP1 and BP2 are disposed may be the emission area EMA.

The bank portion BNP of the bank layer BNL may have a greater thickness than the barrier walls BP1 and BP2. The height of the top surface of the bank portion BNP may be higher than the height of the top surfaces of the barrier walls BP1 and BP2. The bank portion BNP may prevent ink from overflowing to the adjacent sub-pixel SPXn in an inkjet printing process during a fabricating process of the display device 10. The bank layer BNL may include an organic insulating material such as polyimide (PI), but is not limited thereto.

The sub-barrier wall portion SBP1 of the bank layer BNL may be disposed in the sub-region SA of each sub-pixel SPXn. The sub-barrier wall portion SBP1 may have a shape extending in the first direction DR1 and the second direction DR2, and may be disposed to surround the second opening OP2 disposed in the sub-region SA. For example, the sub-barrier wall portion SBP1 may be the remaining area except for the barrier walls BP1 and BP2 in the sub-region SA. The sub-barrier wall portion SBP1 may extend in the first direction DR1 and the second direction DR2 and be integrated with the barrier walls BP1 and BP2 and the bank portion BNP of the bank layer BNL. The thickness of the sub-barrier wall portion SBP1 may be smaller than the thickness of each of the barrier walls BP1 and BP2 and the thickness of the bank portion BNP may be greater than the thickness of the sub-barrier wall portion SBP1.

The sub-barrier wall portion SBP1 of the bank layer BNL may be disposed on the first insulating layer PAS1. For example, the sub-barrier wall portion SBP1 of the bank layer BNL may be directly disposed on the first insulating layer PAS1, and may have a structure in which at least a part thereof protrudes from the top surface of the first insulating layer PAS1.

According to an embodiment, the bank layer BNL and the first insulating layer PAS1 may include contact portions CT1 and CT2. The contact portions CT1 and CT2 may be formed at the portion of the sub-region SA in which the contact electrode CNE and an electrode RME are connected. The first insulating layer PAS1 may be disposed on the via layer VIA, but may partially expose the layers disposed thereunder at the parts in which the contact portions CT1 and CT2 are formed. The barrier walls BP1 and BP2 of the bank layer BNL may partially expose the layers disposed thereunder at the parts in which the contact portions CT1 and CT2 are formed.

The contact portions CT1 and CT2 formed in the first insulating layer PAS1 and the bank layer BNL may be disposed to overlap different electrodes RME. For example, the contact portions CT1 and CT2 may include a first contact portion CT1 disposed to overlap the first electrode RME1 and a second contact portion CT2 disposed in the sub-region SA to overlap the second electrode RME2 in the sub-region SA. The first contact portion CT1 and the second contact portion CT2 may penetrate the bank layer BNL and the first insulating layer PAS1 to partially expose the top surface of the first electrode RME1 or the second electrode RME2 thereunder. The electrode RME exposed by each of the contact portions CT1 and CT2 may be in electrical contact with the contact electrode CNE.

The light emitting elements ED may be arranged in the emission area EMA. The light emitting elements ED may be disposed between the barrier walls BP1 and BP2 of the bank layer BNL and may have both ends disposed on the electrodes RME different from each other, respectively. For example, the light emitting element ED may be disposed such that the first end is disposed on the first electrode RME1 and the second end is disposed on the second electrode RME2. The length of the light emitting element ED may be longer than the distance between the electrodes RME spaced apart in the second direction DR2, and may be shorter than the width of the first opening OP1 of the bank layer BNL.

The light emitting elements ED may be directly disposed on the first insulating layer PAS1. The light emitting element ED may be disposed such that a direction in which the light emitting element ED extends is parallel to the top surface of the substrate SUB. As will be described below, the light emitting element ED may include semiconductor layers arranged in a direction in which the light emitting element ED extends, and the semiconductor layers may be sequentially arranged along the direction parallel to the top surface of the substrate SUB. However, the disclosure is not limited thereto, and the semiconductor layers may be arranged in the direction perpendicular to the substrate SUB in case that the light emitting element ED has another structure.

The light emitting elements ED disposed in each sub-pixel SPXn may emit light of different wavelength bands depending on a material constituting the semiconductor layer. However, the disclosure is not limited thereto, and the light emitting elements ED arranged in each sub-pixel SPXn may include the semiconductor layer of the same material and emit light of the same color. The light emitting elements ED may be electrically connected to the electrode RME and the conductive layers below the via layer VIA while being in electrical contact with the contact electrodes CNE (CNE1 and CNE2), and may emit light of a specific wavelength band by receiving an electrical signal.

The second insulating layer PAS2 may be partially disposed on the light emitting element ED. For example, the second insulating layer PAS2 may have a width smaller than the length of the light emitting element ED and be disposed on the light emitting element ED to expose both ends of the light emitting element ED while surrounding the light emitting element ED. During the fabricating process of the display device 10, the second insulating layer PAS2 may be disposed to cover the light emitting element ED, the electrodes RME, and the first insulating layer PAS1 and then may be partially removed to expose both ends of the light emitting element ED. The second insulating layer PAS2 may be disposed to extend in the first direction DR1 on the first insulating layer PAS1 in a plan view, thereby forming a linear or island-like pattern in each sub-pixel SPXn. The second insulating layer PAS2 may protect the light emitting element ED while fixing the light emitting element ED during the fabricating process of the display device 10.

The contact electrodes CNE may be disposed on the light emitting element ED, the second insulating layer PAS2 and the bank layer BNL. The contact electrodes CNE may be directly disposed on (or disposed directly on) the light emitting element ED to be electrically connected to the light emitting element ED and fix the light emitting elements ED.

The contact electrode CNE may include the first contact electrode CNE1 and the second contact electrode CNE2 disposed in each sub-pixel SPXn. The first contact electrode CNE1 may be disposed on the first electrode RME1, and the bank portion BNP and the first barrier wall portion BP1 of the bank layer BNL. The second contact electrode CNE2 may be disposed on the second electrode RME2, and the bank portion BNP and the second barrier wall portion BP2 of the bank layer BNL.

The first contact electrode CNE1 may be directly disposed on the bank portion BNP and the first barrier wall portion BP1 of the bank layer BNL in the emission area EMA, and be in electrical contact with the first end of the light emitting element ED. The first contact electrode CNE1 may be disposed from the emission area EMA to the sub-region SA over the bank portion BNP of the bank layer BNL. The first contact electrode CNE1 may be in contact with the first electrode RME1 through the first contact portion CT1 penetrating the first barrier wall portion BP1 of the bank layer BNL and the first insulating layer PAS1 in the sub-region SA.

The second contact electrode CNE2 may be directly disposed on the bank portion BNP of the bank layer BNL and the second barrier wall portion BP2 in the emission area EMA and may be in electrical contact with the second end of the light emitting element ED. The second contact electrode CNE2 may be disposed from the emission area EMA to the sub-region SA over the bank portion BNP of the bank layer BNL. The second contact electrode CNE2 may be in electrical contact with the second electrode RME2 through the second contact portion CT2 penetrating the second barrier wall portion BP2 of the bank layer BNL and the first insulating layer PAS1 in the sub-region SA.

The first contact electrode CNE1 and the second contact electrode CNE2 may be spaced apart from each other by a distance sufficient to contact electrically ends of the light emitting element ED, respectively. In an embodiment, the distance between the first contact electrode CNE1 and the second contact electrode CNE2 may be smaller than the length of the light emitting element ED. The gap between the first contact electrode CNE1 and the second contact electrode CNE2 may be smaller than the width of the first opening OP1 of the bank layer BNL.

The first contact electrode CNE1 may be electrically connected to the first transistor T1, so that the first power voltage may be applied to the first contact electrode CNE1, and the second contact electrode CNE2 may be electrically connected to the second voltage line VL2, so that the second power voltage may be applied to the second contact electrode CNE2. Each contact electrode CNE may be in contact the light emitting element ED in the emission area EMA to transmit the power voltage to the light emitting element ED.

However, the disclosure is not limited thereto. In some embodiments, the contact electrodes CNE may be in direct contact with the third conductive layer, and may be electrically connected to the third conductive layer through patterns other than the electrodes RME.

In an embodiment, referring to FIGS. 3 and 5, in the sub-region SA, the sub-barrier wall portion SBP1 of the bank layer BNL may expose the top surface of the first insulating layer PAS1 and form a step with the first insulating layer PAS1. In the second opening OP2 of the bank layer BNL, a side surface of the sub-barrier wall portion SBP1 and a side surface of the first insulating layer PAS1 are exposed together. The side surface of the sub-barrier wall portion SBP1 may not be aligned with the side surface of the first insulating layer PAS1. For example, the side surface of the sub-barrier wall portion SBP1 may be disposed to be spaced apart from the side surface of the first insulating layer PAS1 in the second direction DR2 or the first direction DR1. The side surface of the sub-barrier wall portion SBP1 may be in physical contact with the top surface of the first insulating layer PAS1.

In the fabricating method to be described below, an etching process of the bank layer BNL and the first insulating layer PAS1 may be performed using one mask. In this process, an ashing process is performed on the bank layer BNL to remove an area on which the light emitting element ED is mounted. Since the size of the bank layer BNL becomes smaller by performing this ashing process, a side surface of the sub-barrier wall portion SBP1 of the bank layer BNL may be formed to be spaced apart from a side surface of the first insulating layer PAS1.

In an embodiment, a side surface of the first insulating layer PAS1 may be aligned and coincide (or matched) with a side surface of the via layer VIA. In the ashing process of the bank layer BNL described above, the exposed via layer VIA in addition to the bank layer BNL may also be partially etched and removed. For example, the via layer VIA of the area overlapping the first insulating layer PAS1 may be not etched by the ashing process, and the via layer VIA of the area exposed without overlapping the first insulating layer PAS1 may be partially etched by the ashing process so that the thickness thereof may be reduced. Accordingly, a thickness difference between the area overlapping the first insulating layer PAS1 and the area not overlapping the first insulating layer PAS1 may occur in the via layer VIA, thereby forming a side surface of the via layer VIA aligned with a side surface of the first insulating layer PAS1.

By performing the process described above, a first thickness TT1 of the via layer VIA overlapping the first insulating layer PAS1 in the second opening OP2 may be greater than a second thickness TT2 of the via layer VIA that does not overlap the first insulating layer PAS1. Since the thickness of the via layer VIA that does not overlap the first insulating layer PAS1 is reduced by the ashing process, the second thickness TT2 of the via layer VIA may be smaller than the first thickness TT1 of the via layer VIA overlapping the first insulating layer PAS1.

As described above, the display device 10 according to an embodiment may reduce the fabricating costs and improve the productivity by reducing the number of masks in the process of forming the bank layer BNL and the first insulating layer PAS1.

Figure 6:
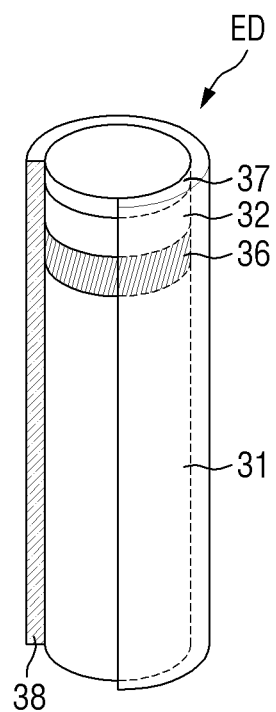
FIG. 6 is a schematic perspective view of a light emitting element according to an embodiment.

FIG. 6 is a schematic perspective view of a light emitting element according to an embodiment.

Referring to FIG. 6, the light emitting element ED may be a light emitting diode. The light emitting element ED may be an inorganic light emitting diode that has a nanometer or micrometer size, and is made of an inorganic material. The light emitting element ED may be aligned between two electrodes having polarity in case that an electric field is formed in a specific direction between two electrodes facing each other.

The light emitting element ED according to an embodiment may have a shape elongated in a direction. The light emitting element ED may have a shape of a cylinder, a rod, a wire, a tube, or the like. However, the shape of the light emitting element ED is not limited thereto, and the light emitting element ED may have a polygonal prism shape such as a regular cube, a rectangular parallelepiped and a hexagonal prism, or may have various shapes such as a shape elongated in a direction and having an outer surface partially inclined.

The light emitting element ED may include a semiconductor layer doped with any conductivity type (e.g., p-type or n-type) dopant. The semiconductor layer may emit light of a specific wavelength band by receiving an electrical signal applied from an external power source. The light emitting element ED may include a first semiconductor layer 31, a second semiconductor layer 32, a light emitting layer 36, an electrode layer 37 and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of AlGaInN, GaN, AlGaN, InGaN, AlN and InN doped with an n-type dopant. The n-type dopant doped into the first semiconductor layer 31 may be Si, Ge, Sn, Se or the like.

The second semiconductor layer 32 may be disposed on the first semiconductor layer 31 with the light emitting layer 36 therebetween. The second semiconductor layer 32 may be a p-type semiconductor, and the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be any one or more of AlGaInN, GaN, AlGaN, InGaN, AlN and InN doped with a p-type dopant. The p-type dopant doped into the second semiconductor layer 32 may be Mg, Zn, Ca, Ba, or the like.

Although it is illustrated in the drawing that the first semiconductor layer 31 and the second semiconductor layer 32 are configured as one layer, the disclosure is not limited thereto. Depending on the material of the light emitting layer 36, the first semiconductor layer 31 and the second semiconductor layer 32 may further include a larger number of layers, such as a cladding layer or a tensile strain barrier reducing (TSBR) layer. For example, the light emitting element ED may further include another semiconductor layer disposed between the first semiconductor layer 31 and the light emitting layer 36 or between the second semiconductor layer 32 and the light emitting layer 36. The semiconductor layer disposed between the first semiconductor layer 31 and the light emitting layer 36 may be one or more of AlGaInN, GaN, AlGaN, InGaN, AlN, InN and SLs doped with an n-type dopant, and the semiconductor layer disposed between the second semiconductor layer 32 and the light emitting layer 36 may be one or more of AlGaInN, GaN, AlGaN, InGaN, AlN and InN doped with a p-type dopant.

The light emitting layer 36 may be disposed between the first semiconductor layer 31 and the second semiconductor layer 32. The light emitting layer 36 may include a material having a single or multiple quantum well structure. In case that the light emitting layer 36 includes a material having a multiple quantum well structure, quantum layers and well layers may be stacked alternately. The light emitting layer 36 may emit light by coupling of electron-hole pairs according to an electrical signal applied through the first semiconductor layer 31 and the second semiconductor layer 32. The light emitting layer 36 may include a material such as AlGaN, AlGaInN, or InGaN. For example, in case that the light emitting layer 36 has a multiple quantum well structure in which quantum layers and well layers are alternately stacked, the quantum layer may include a material such as AlGaN or AlGaInN, and the well layer may include a material such as GaN or AlInN.

The light emitting layer 36 may have a structure in which semiconductor materials having large band gap energy and semiconductor materials having small band gap energy are alternately stacked, and may include other group III to V semiconductor materials according to the wavelength band of the emitted light. The light emitted by the light emitting layer 36 is not limited to the light of the blue wavelength band, but the light emitting layer 36 may also emit light of a red or green wavelength band in some cases.

The electrode layer 37 may be an ohmic connection electrode. However, the disclosure is not limited thereto, and it may be a Schottky connection electrode. The light emitting element ED may include at least one electrode layer 37. The light emitting element ED may include one or more electrode layers 37, but the disclosure is not limited thereto, and the electrode layer 37 may be omitted.

In the display device 10, in case that the light emitting element ED is electrically connected to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, or ITZO.

The insulating film 38 is arranged to surround the outer surfaces of the semiconductor layers and electrode layers described above. For example, the insulating film 38 may be disposed to surround at least the outer surface of the light emitting layer 36, and may be formed to expose both ends of the light emitting element ED in the longitudinal direction. Further, in cross-sectional view, the insulating film 38 may have a top surface, which is rounded in a region adjacent to at least one end of the light emitting element ED.

The insulating film 38 may include at least one of materials having insulating properties, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$). It is illustrated in the drawing that the insulating film 38 is formed as a single layer, but the disclosure is not limited thereto. In some embodiments, the insulating film 38 may be formed in a multilayer structure having layers stacked therein.

The insulating film 38 may perform a function of protecting the semiconductor layers and the electrode layer of the light emitting element ED. The insulating film 38 may prevent an electrical short circuit that is likely to occur at the light emitting layer 36 in case that an electrode to which an electrical signal is transmitted is in contact (e.g., electrical or direct contact) with the light emitting element ED. The insulating film 38 may prevent a decrease in luminous efficiency of the light emitting element ED.

Further, the insulating film 38 may have an outer surface which is surface-treated. The light emitting elements ED may be aligned in such a way of spraying the ink in which the light emitting elements ED are dispersed on the electrodes. Here, the surface of the insulating film 38 may be treated to have a hydrophobic property or hydrophilic property in order to keep the light emitting elements ED in the dispersed state without being aggregated with other adjacent light emitting elements ED in the ink.

Hereinafter, a fabricating process of the above-described display device 10 will be described with reference to other drawings.

FIGS. 7 to 12 are schematic cross-sectional views sequentially illustrating a fabricating process of a display device according to an embodiment. The fabricating process of the display device 10 illustrated in FIGS. 7 to 12 may correspond to the display device 10 of FIG. 3 described above.

Figure 7:
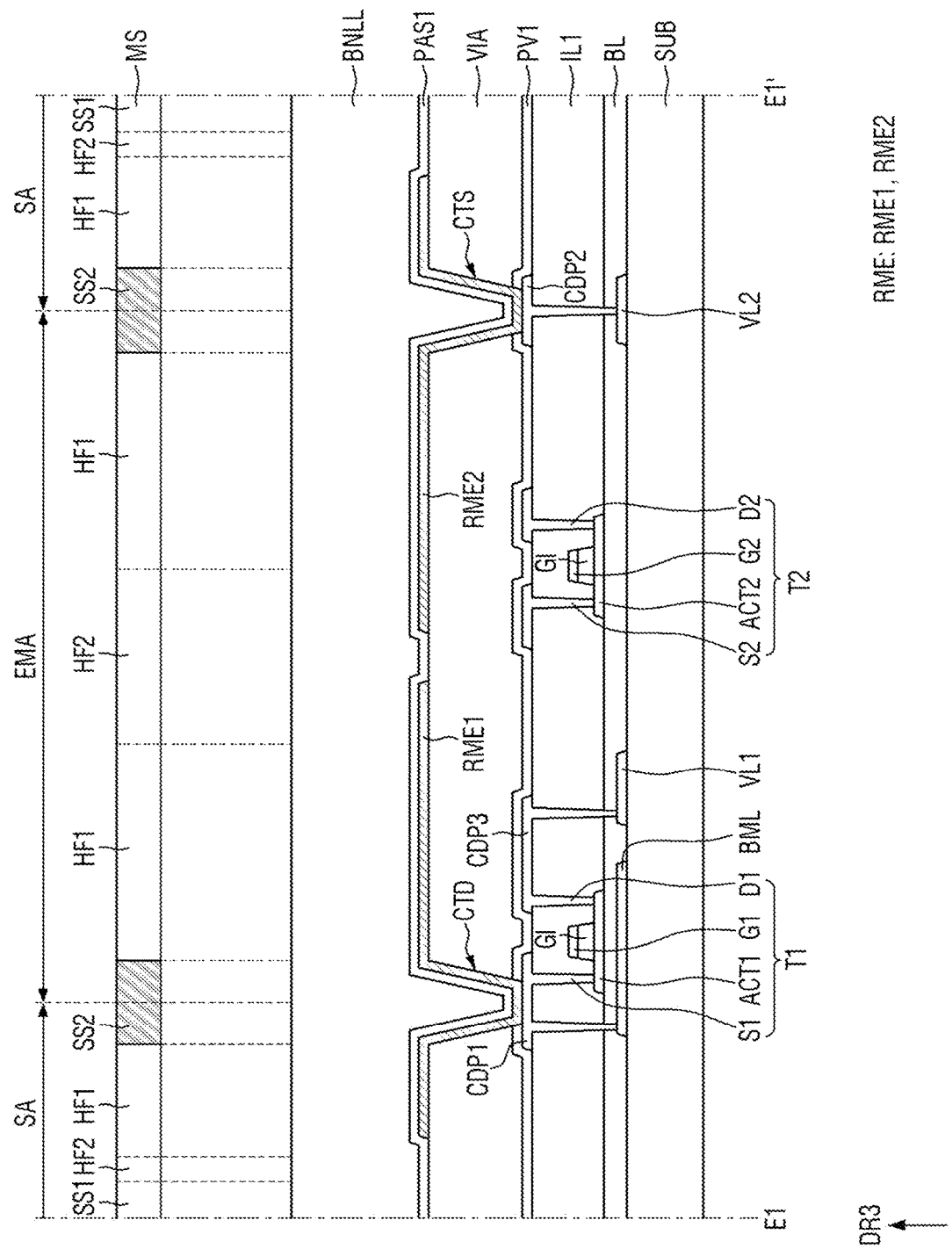
FIGS. 7 to 12 are schematic cross-sectional views sequentially illustrating a fabricating process of a display device according to an embodiment.

First, referring to FIG. 7, a substrate SUB is prepared, and a buffer layer BL, a semiconductor layer, first to third conductive layers, an interlayer insulating layer IL1, a first passivation layer PV1, a via layer VIA, an electrodes RME1 and RME2, and a first insulating layer PAS1 may be formed on the substrate SUB.

Each of the first to third conductive layers and the electrodes RME disposed on the substrate SUB may be formed by depositing a material, e.g., a metal material, of each layer, and performing a patterning process using a mask. Further, the buffer layer BL, the gate insulating layer G1, the interlayer insulating layer IL1, the via layer VIA, and a first insulating layer PAS1 disposed on the substrate SUB may be formed by applying a material, e.g., an insulating material, of each layer, or by a patterning process using a mask, if necessary. A description of the structure of layers disposed on the substrate SUB is the same as that described above, and thus a detailed description thereof will be omitted.

Next, a bank material layer BNLL may be formed on the first insulating layer PAS1. The bank material layer BNLL may include an organic insulating material such as polyimide (PI) described above. The bank material layer BNLL may be formed by using a solution application method such as spin coating. Next, a mask MS is aligned on the bank material layer BNLL. The mask MS may be a half-tone mask or a multi-tone mask. The mask MS may include a transmission area SS1 in which light is completely transmitted, a blocking area SS2 in which light is blocked and semi-transmission areas HF1 and HF2 in which the amount of light transmitted may be controlled. The semi-transmission areas HF1 and HF2 may include a first semi-transmission area HF1 and a second semi-transmission area HF2 in which a greater amount of light is transmitted than the first semi-transmission area HF1.

The transmission area SS1 among the respective areas of the mask MS may correspond to a part in which the bank material layer BNLL is to be completely removed, e.g., the second opening OP2 of the sub-region SA. The blocking area SS2 may correspond to an area in which a bank portion BNP of the bank layer BNL will be formed. The first semi-transmission area HF1 may correspond to an area in which the barrier walls BP1 and BP2 of the bank layer BNL will be formed, and the second semi-transmission area HF2 may correspond to an area in which the sub-barrier wall portion SBP1 and a protection portion PRT to be described below will be formed.

Next, an exposure process in which light is irradiated toward the substrate SUB may be performed on the mask MS. The light may be UV light. The light may pass through the transmission area SS1 of the mask MS to be irradiated onto the bank material layer BNLL, and may be blocked in the blocking area SS2. The amount of light may be adjusted and transmitted in the first semi-transmission area HF1 of the mask MS to be irradiated onto the bank material layer BNLL, and a greater amount of light than the first semi-transmission area HF1 may be transmitted in the second semi-transmission area HF2 to be irradiated onto the bank material layer BNLL. The bank material layer BNLL onto which light may be irradiated is melted by a developer in a development process to be described below. After the exposure process is performed, the mask MS is removed.

Figure 8:
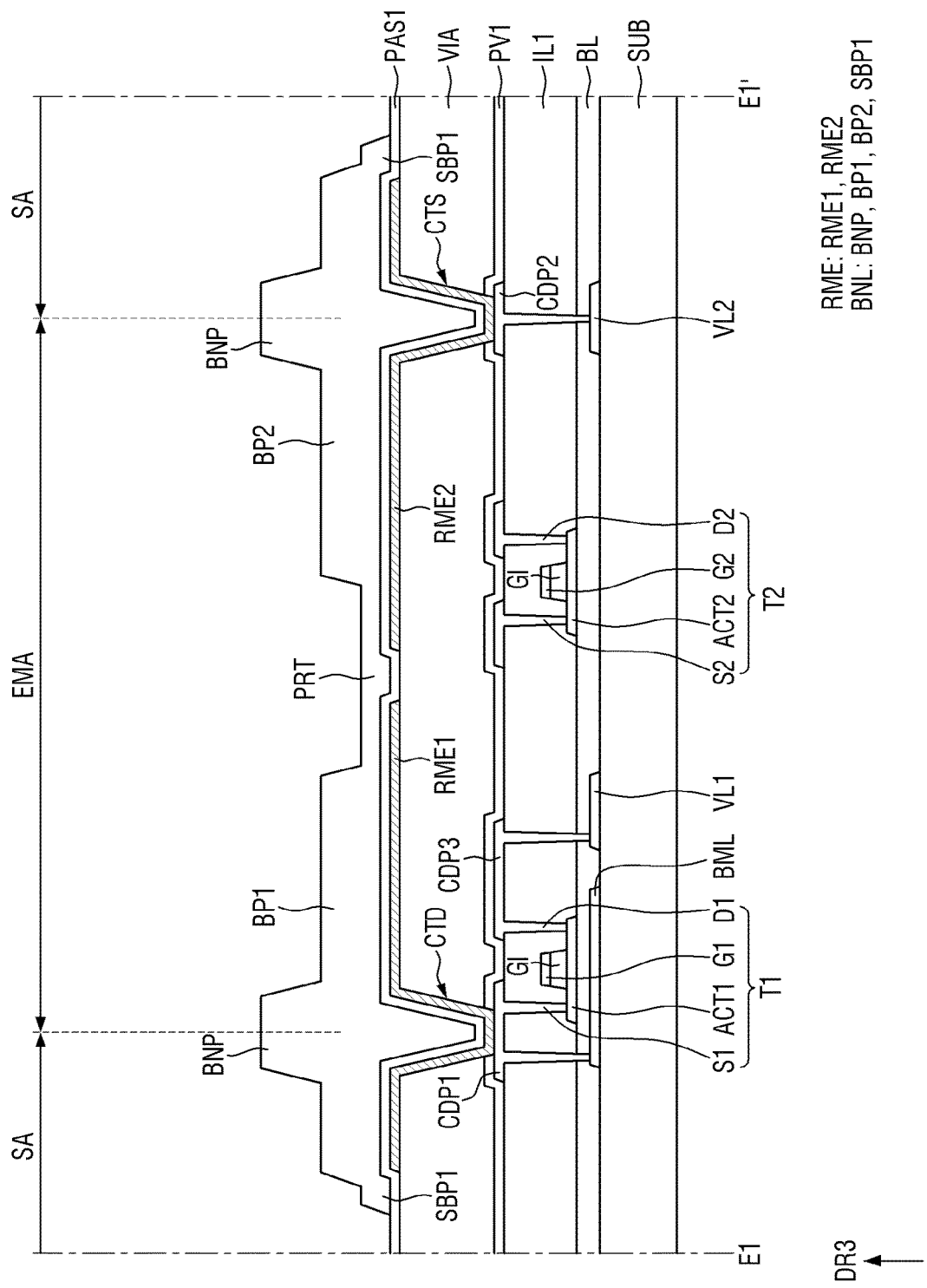

Next, referring to FIG. 8, a developer is applied to the bank material layer BNLL to form the bank layer BNL. The bank layer BNL may be completely removed from the part corresponding to the transmission area SS1 of the mask MS and may be formed as the bank portion BNP at the part corresponding to the blocking area SS2. Further, in the bank layer BNL, the barrier walls BP1 and BP2 having a height lower than the bank portion BNP may be formed at the part corresponding to the first semi-transmission area HF1 of the mask MS, and the sub-barrier wall portion SBP1 and the protection portion PRT having a height lower than the barrier walls BP1 and BP2 may be formed at the part corresponding to the second semi-transmission area HF2 of the mask MS.

The protection portion PRT may correspond to an area in which the light emitting element ED to be described below may be aligned and mounted. In the etching process of the first insulating layer PAS1 to be described below, the protection portion PRT may prevent the top surface of the first insulating layer PAS1 from being etched by the etching solution.

Figure 9:
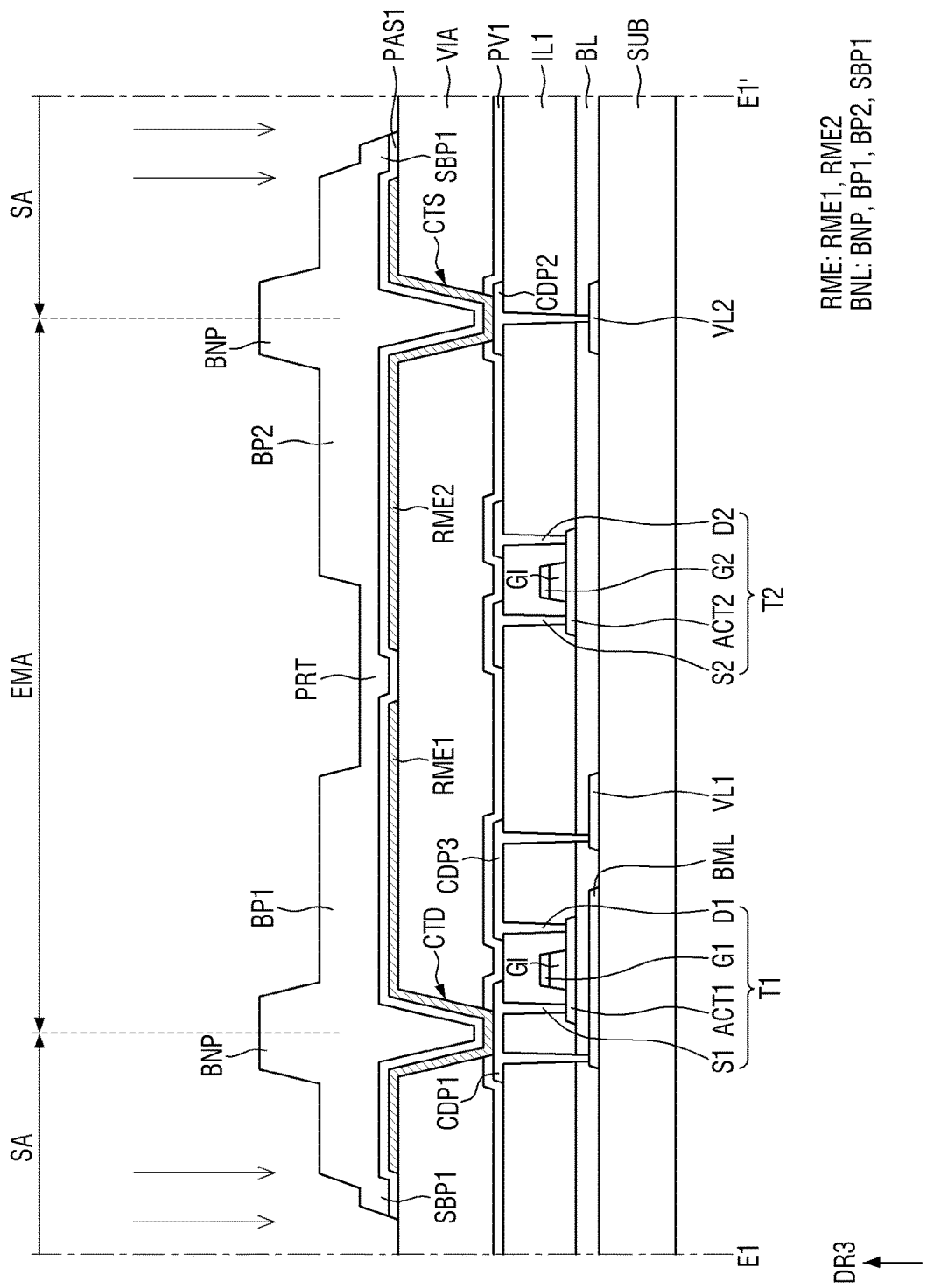

Next, referring to FIG. 9, the first insulating layer PAS1 may be etched by using the bank layer BNL as a mask. For example, a dry etching process may be performed on the substrate SUB on which the bank layer BNL may be formed. The first insulating layer PAS1 in an area masked by the bank layer BNL may remain, and the first insulating layer PAS1 in an unmasked area may be etched and removed.

Figure 10:
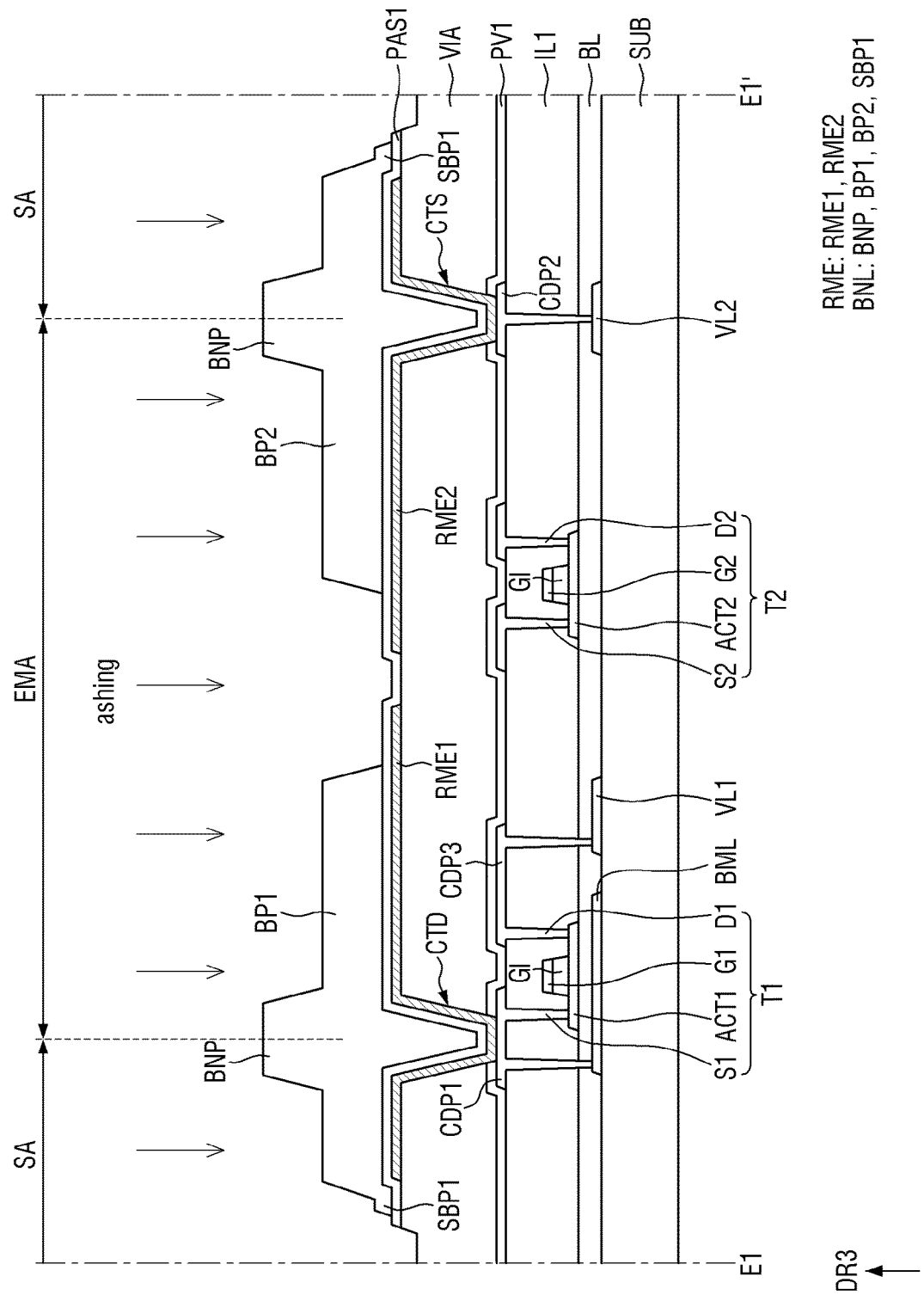

Next, referring to FIG. 10, an ashing process for removing the protection portion PRT formed in an area on which the light emitting element ED is to be mounted may be performed. The ashing process may be performed by using an oxygen ($O_2$) gas, which excludes fluoride (F) ions or contains a tiny amount of fluoride (F) ions, as a reaction gas. In case that the ashing process is performed, the surface of the bank layer BNL may be removed to reduce the overall size. The protection portion PRT of the bank layer BNL may be completely removed by performing the ashing process to expose the first insulating layer PAS1 between the barrier walls BP1 and BP2 on which the light emitting element ED is mounted. The overall size of the remaining bank layer BNL may be reduced by performing the ashing process. Accordingly, in the sub-region SA, a side surface of the sub-barrier wall portion SBP1 of the bank layer BNL disposed on the first insulating layer PAS1 may be disposed to be spaced apart inward from a side surface of the first insulating layer PAS1. A portion of the surface of the via layer VIA that is not masked by the first insulating layer PAS1 may be removed by performing the ashing process and the thickness thereof may be reduced.

Figure 11:
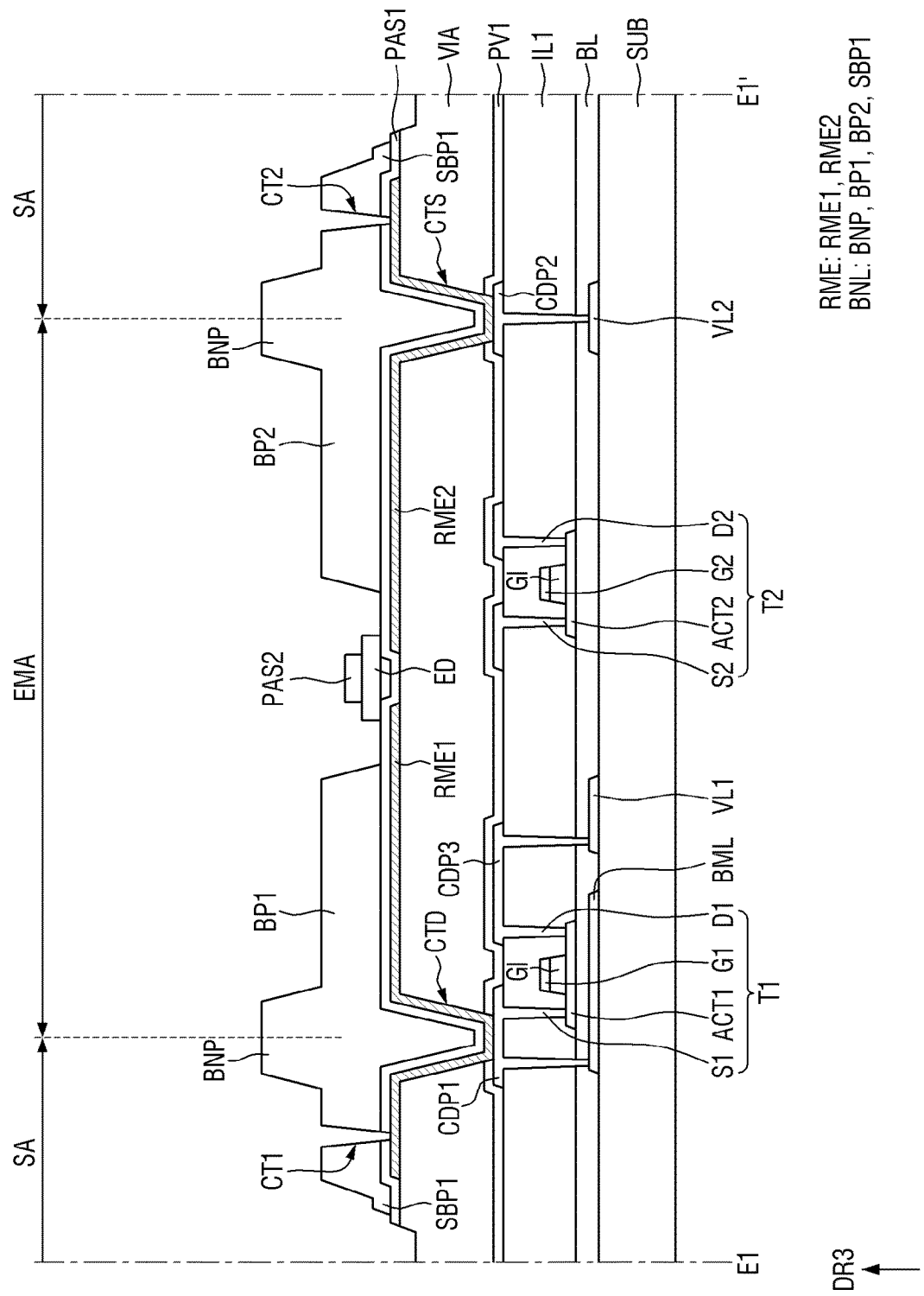

Next, referring to FIG. 11, light emitting elements ED are formed. The light emitting elements ED may be disposed on the electrodes RME by performing an inkjet printing process. In case that an electrical signal is applied to the electrodes RME after ink in which the light emitting elements ED may be dispersed is sprayed into an area surrounded by the bank layer BNL, the light emitting elements ED in the ink may be placed on the electrodes RME while changing their own positions and orientations. The light emitting elements ED may be aligned by an electric field generated by an electrical signal applied to the electrode RME in the first opening OP1 of the bank layer BNL. Each light emitting element ED may be disposed such that the first end is placed on the first electrode RME1 and the second end is placed on the second electrode RME2.

Next, the second insulating layer PAS2 may be formed. The second insulating layer PAS2 may be formed by depositing an inorganic insulating material on the substrate SUB on which the light emitting element ED and the bank layer BNL are formed and patterning the inorganic insulating material using a mask. During the patterning process of the second insulating layer PAS2, a portion of the bank layer BNL and the first insulating layer PAS1 may be etched to form the first contact portion CT1 and the second contact portion CT2.

Figure 12:
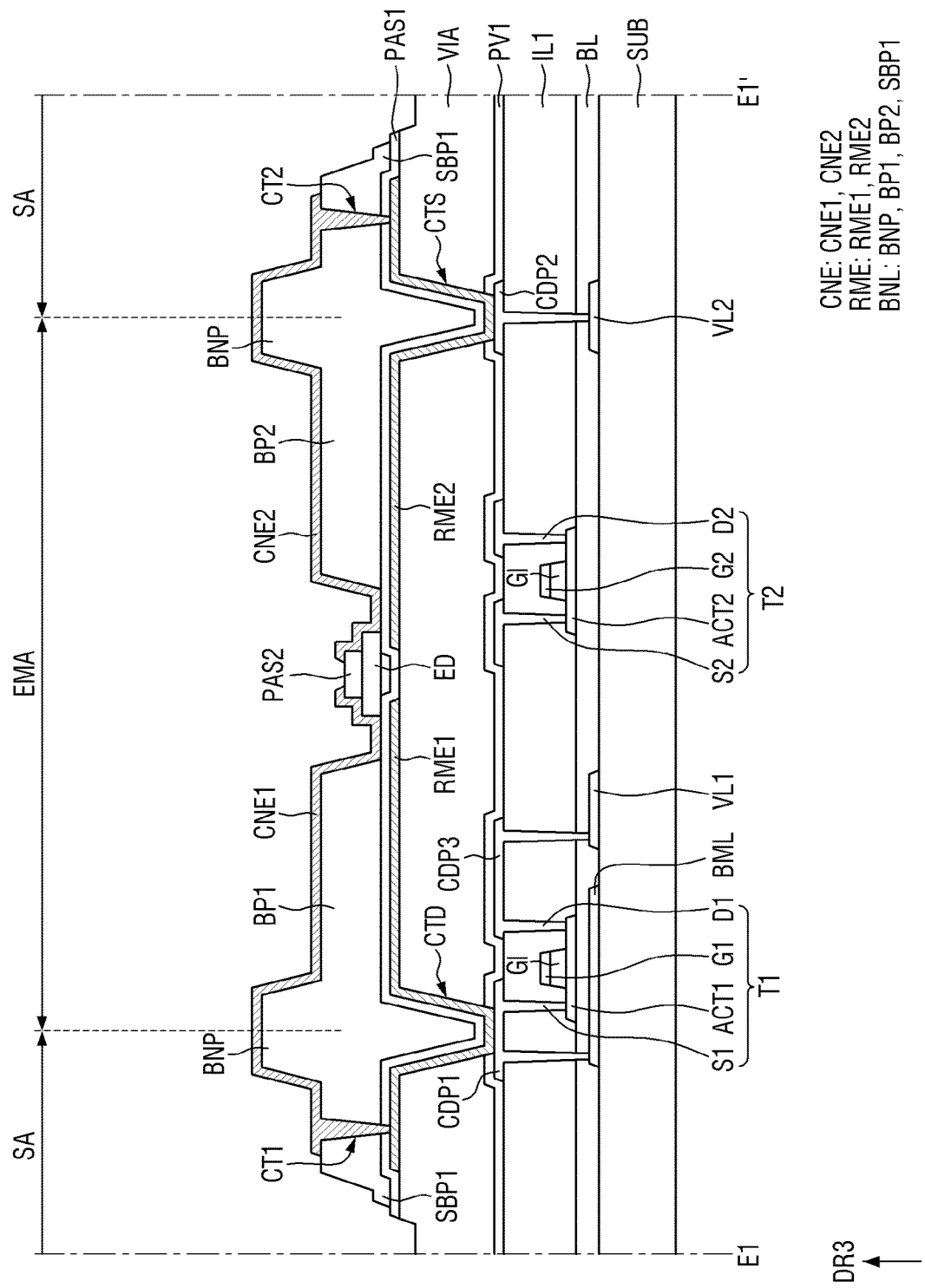

Next, referring to FIG. 12, the contact electrodes CNE may be formed by depositing a contact electrode material layer on the light emitting element ED, the second insulating layer PAS2 and the bank layer BNL and by patterning the contact electrode material layer. Each of the contact electrodes CNE may be in contact (e.g., direct contact) with the light emitting element ED and may be in contact (e.g., direct contact) with the bank layer BNL and the first insulating layer PAS1. Accordingly, the display device 10 according to an embodiment is fabricated.

As described above, the method for fabricating the display device 10 according to an embodiment may use one mask to form the bank layer BNL and the first insulating layer PAS1, thereby reducing the fabricating costs and improving productivity by reducing the number of masks.

Figure 13:
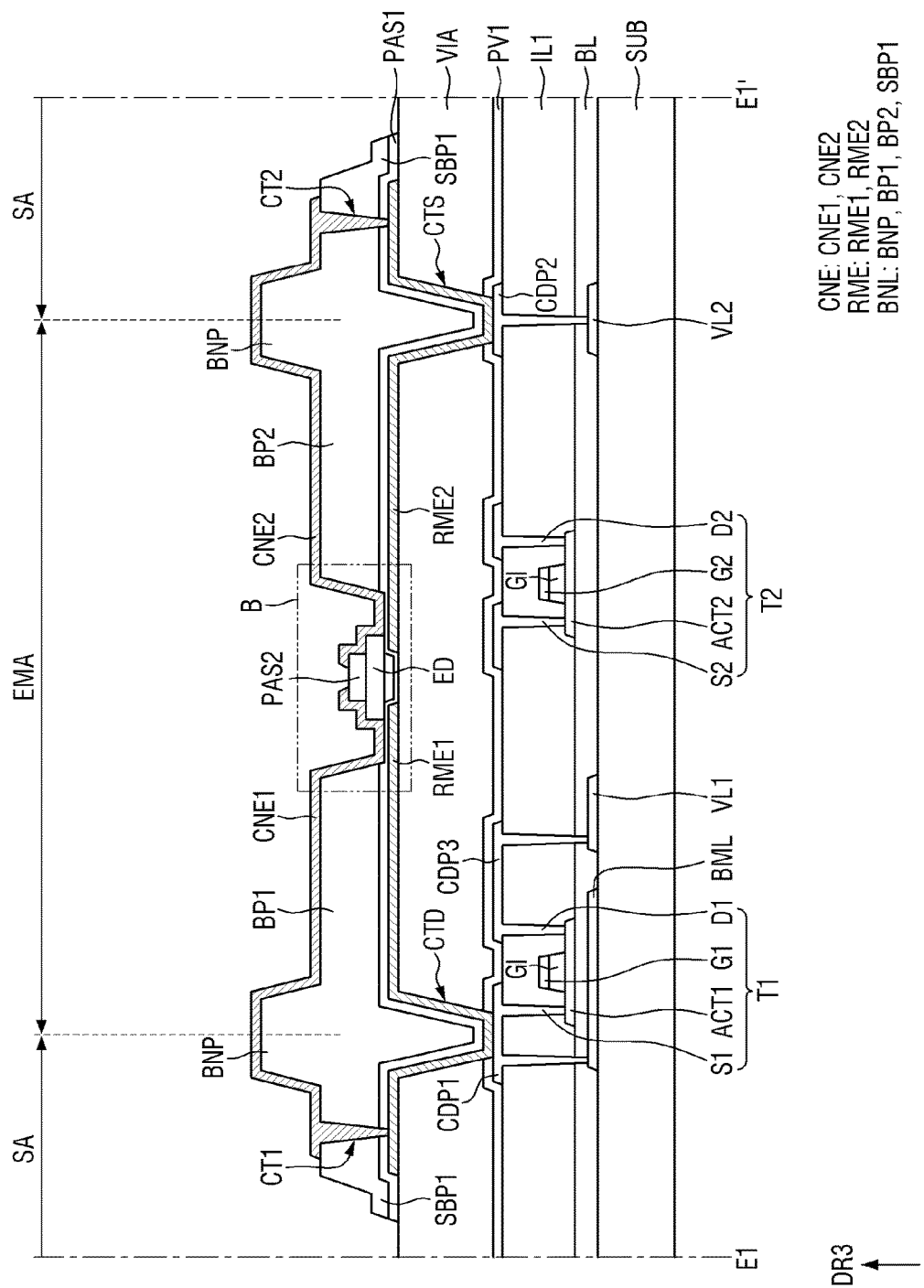
FIG. 13 is a schematic cross-sectional view of a display device according to another embodiment.
Figure 14:
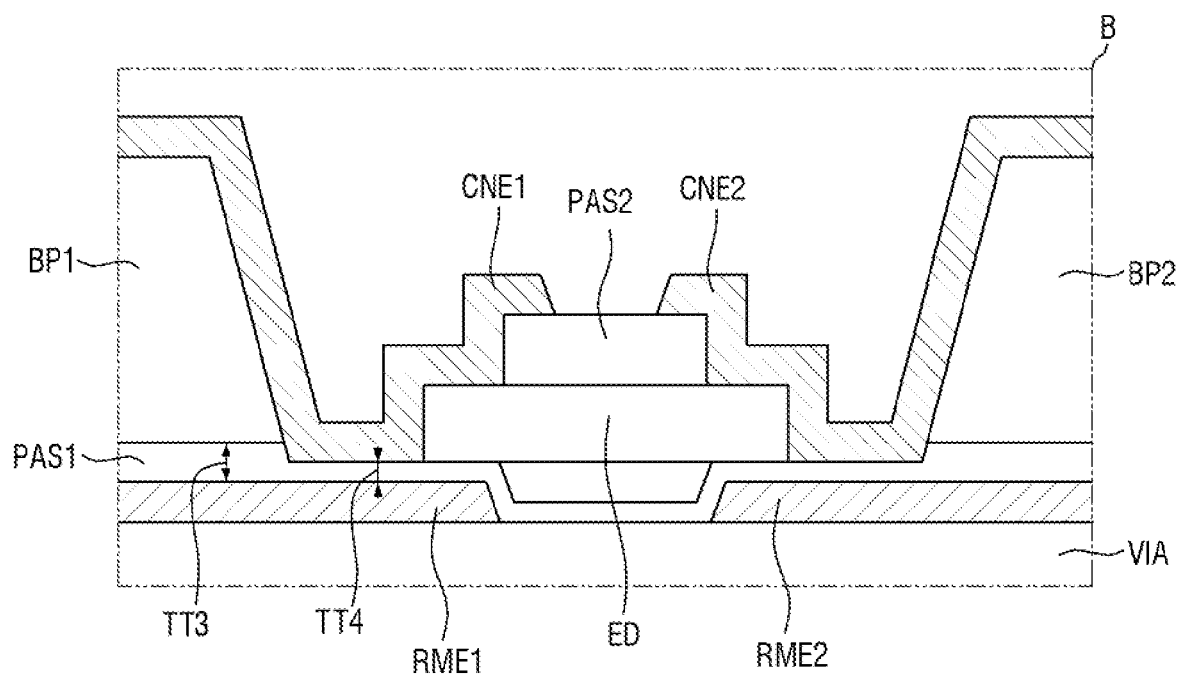
FIG. 14 is a schematic enlarged view of area B of FIG. 13.

FIG. 13 is a schematic cross-sectional view of a display device according to another embodiment. FIG. 14 is a schematic enlarged view of area B of FIG. 13.

Referring to FIG. 13, the embodiment is different from the embodiment described above in that side surfaces of the bank layer BNL and the first insulating layer PAS1 may coincide (or may be matched) with each other and the via layer VIA has the uniform thickness as a whole. For example, there may be a difference in that the thickness of the first insulating layer PAS1 overlapping the bank layer BNL may be greater than the thickness of the first insulating layer PAS1 that does not overlap the bank layer BNL. In the following description, redundant description of the above-described embodiment will be omitted while focusing on differences.

According to an embodiment, a side surface of the sub-barrier wall portion SBP1 of the bank layer BNL in the sub-region SA may be aligned and coincide (or may be matched) with a side surface of the first insulating layer PAS1. Unlike the embodiments of FIGS. 3 to 12, in the fabricating method to be described below, the ashing process for removing the bank layer BNL of the area on which the light emitting element ED is mounted may be not performed. Accordingly, since the size of the bank layer BNL is not reduced, the side surface of the sub-barrier wall portion SBP1 may be aligned and coincide with the side surface of the first insulating layer PAS1. Further, the via layers VIA may have the same thickness as a whole. For example, the thickness of the via layer VIA overlapping the first insulating layer PAS1 and the thickness of the via layer VIA that does not overlap the first insulating layer PAS1 may be the same.

Referring to FIG. 14, in an embodiment, the thickness of the first insulating layer PAS1 may be different depending on the area. Specifically, a third thickness TT3 of the first insulating layer PAS1 overlapping the bank layer BNL may be greater than a fourth thickness TT4 that does not overlap the bank layer BNL. The first insulating layer PAS1 that does not overlap the bank layer BNL may overlap the first opening OP1 of the bank layer BNL.

Like the fabricating method to be described below, in an embodiment, the protection portion PRT of the bank layer BNL and the first insulating layer PAS1 may be simultaneously etched. In the area that does not overlap the bank layer BNL, the first insulating layer PAS1 may be all be etched. In the area in which the protection portion PRT of the bank layer BNL is disposed, a portion of the exposed surface of the first insulating layer PAS1 may be etched after the protection portion PRT is all etched. Accordingly, the third thickness TT3 of the first insulating layer PAS1 overlapping the bank layer BNL may be greater than the fourth thickness TT4 of the first insulating layer PAS1 that does not overlap the bank layer BNL.

Figure 15:
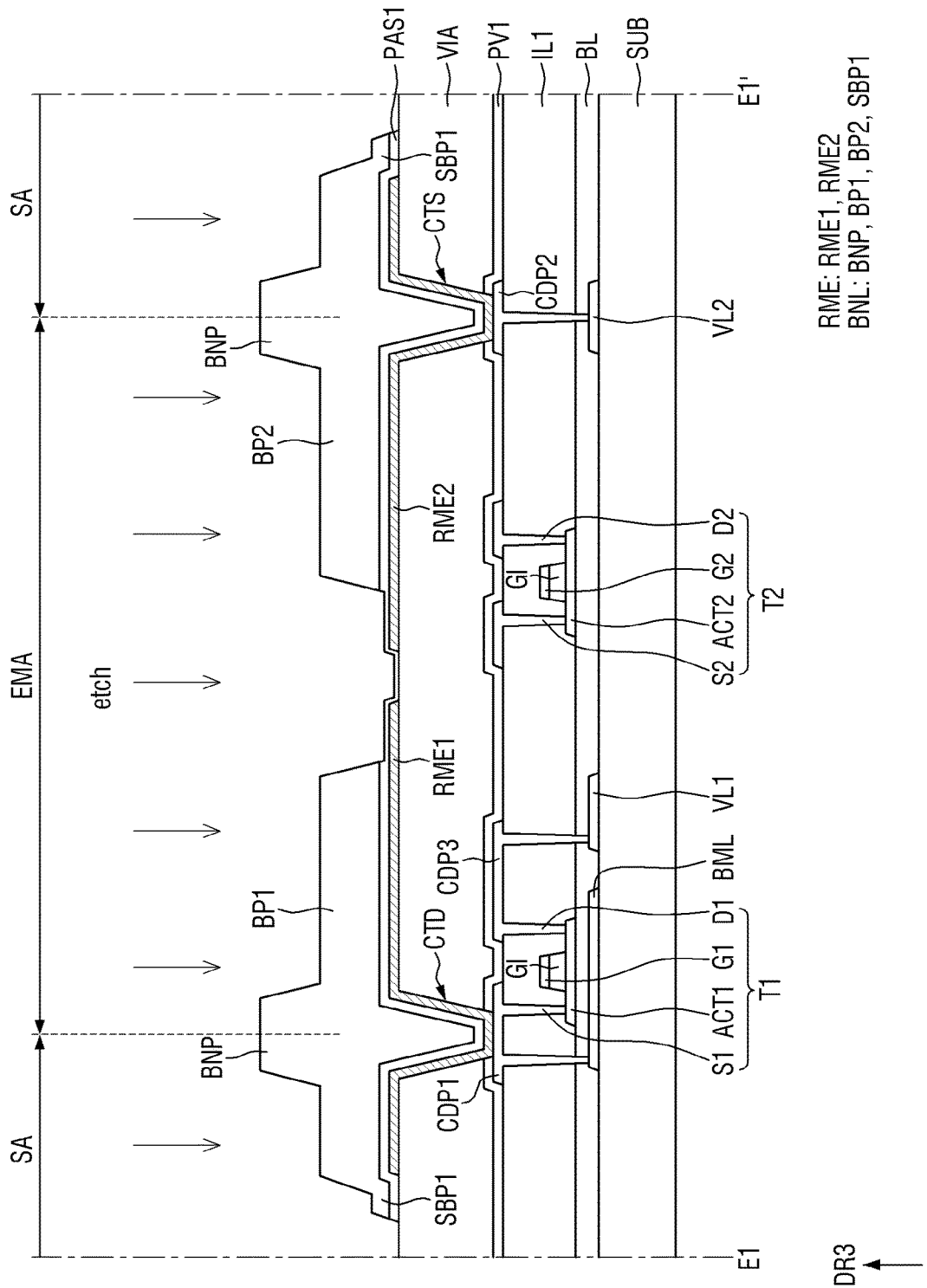
FIGS. 15 to 16 are schematic cross-sectional views sequentially illustrating a fabricating process of a display device according to another embodiment.
Figure 16:
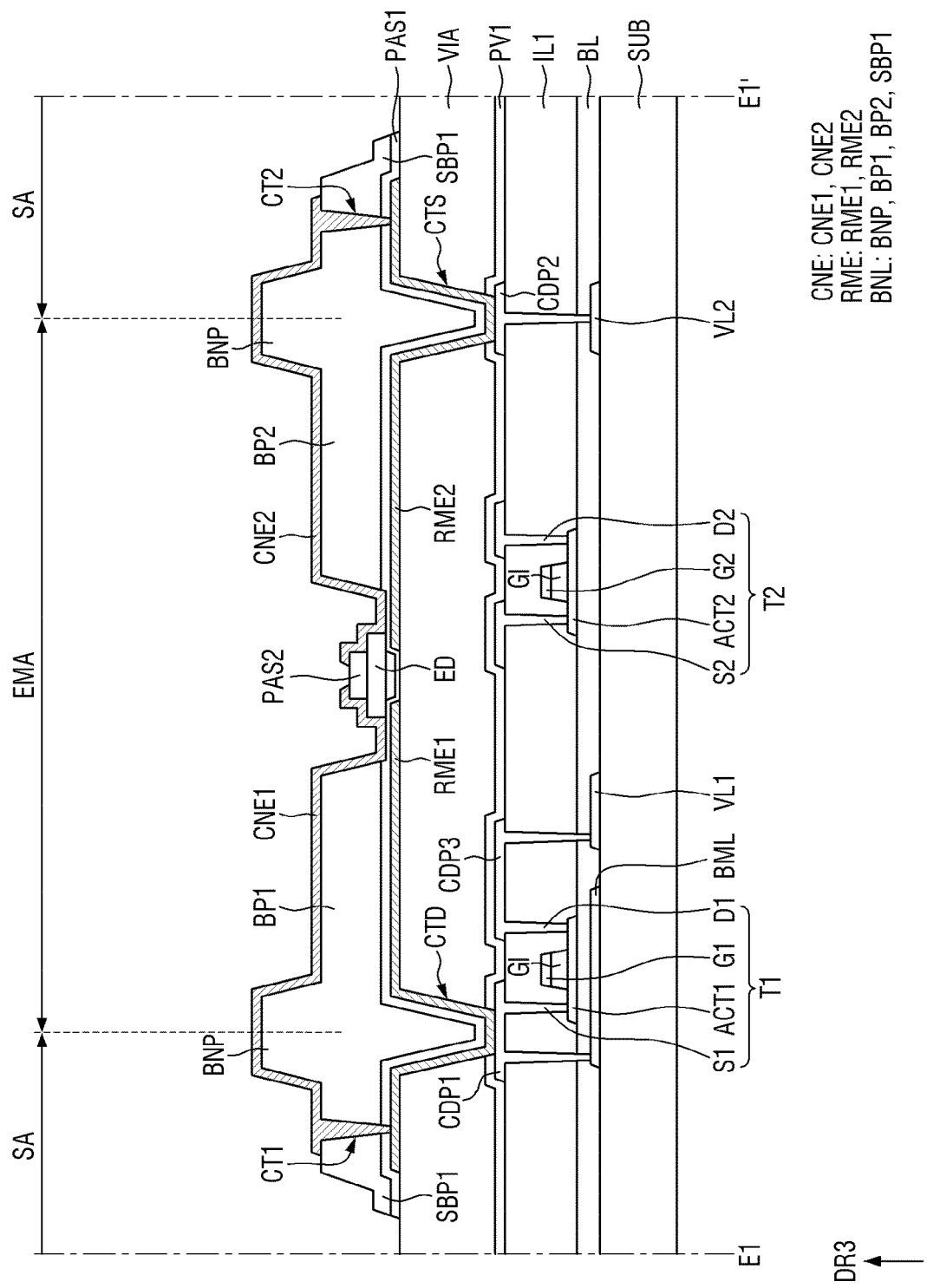

FIGS. 15 to 16 are schematic cross-sectional views sequentially illustrating a fabricating process of a display device according to another embodiment.

Referring to FIG. 15, the bank layer BNL may be formed in the same process as the process of FIG. 8 described above. Next, the first insulating layer PAS1 and the protection portion PRT of the bank layer BNL may be etched by using the bank layer BNL as a mask. For example, a dry etching process may be performed on the substrate SUB on which the bank layer BNL is formed. The first insulating layer PAS1 of the area masked by the bank layer BNL may remain, and the first insulating layer PAS1 of the unmasked area may be etched and removed. For example, as the overall size of the bank layer BNL may be reduced by performing the dry etching process, the protection portion PRT may also be etched and removed. The first insulating layer PAS1 disposed under the protection portion PRT may not be completely etched and removed by the protection portion PRT and a portion of the surface thereof may be removed so that the thickness is reduced. In case that the size of the bank layer BNL is reduced, the masking area of the upper portion of the first insulating layer PAS1 may also be reduced. Accordingly, a side surface of the first insulating layer PAS1 may be aligned and coincide with a side surface of the bank layer BNL.

Next, as illustrated in FIG. 16, the display device 10 according to an embodiment may be fabricated by forming the light emitting element ED and the contact electrodes CNE on the substrate SUB on which the bank layer BNL is formed.

As described above, the method for fabricating the display device 10 according to an embodiment may use one mask to form the bank layer BNL and the first insulating layer PAS1, thereby reducing the fabricating costs and improving productivity by reducing the number of masks.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
    a via layer disposed on a substrate;
    a first electrode and a second electrode disposed on the via layer and spaced apart from each other;
    a first insulating layer disposed on the first electrode and the second electrode;
    light emitting elements disposed on the first insulating layer and disposed on the first electrode and the second electrode;
    a bank layer disposed on the first insulating layer and comprising a first opening in which the light emitting elements are disposed and a second opening spaced apart from the first opening;
    a second insulating layer disposed on the light emitting elements; and
    a first contact electrode and a second contact electrode disposed on the bank layer, the light emitting elements, and the second insulating layer, and spaced apart from each other, the first contact electrode electrically contacting an end of each of the light emitting elements, the second contact electrode electrically contacting another end of each of the light emitting elements,
    wherein in the second opening, a thickness of the via layer overlapping the first insulating layer in a plan view is greater than a thickness of the via layer that does not overlap the first insulating layer in a plan view.

2. The display device of claim 1, wherein in the second opening,
    a side surface of the first insulating layer and a side surface of the via layer are exposed, and
    a side surface of the first insulating layer and a side surface of the via layer are aligned and coincide with each other.

3. The display device of claim 1, wherein the bank layer comprises:
    a first barrier wall portion overlapping the first electrode in a plan view;
    a second barrier wall portion spaced apart from the first barrier wall portion, the first opening being disposed between the first barrier wall portion and the second barrier wall portion and overlapping the second electrode in a plan view;
    a bank portion surrounding the first barrier wall portion and the second barrier wall portion; and
    a sub-barrier wall portion surrounding the second opening.

4. The display device of claim 3, wherein a thickness of the bank portion is greater than a thickness of each of the first barrier wall portion and the second barrier wall portion, and the thickness of each of the first barrier wall portion and the second barrier wall portion is greater than a thickness of the sub-barrier wall.

5. The display device of claim 3, wherein a side surface of the sub-barrier wall portion of the bank layer contacts a top surface of the first insulating layer and is spaced apart from a side surface of the first insulating layer.

6. The display device of claim 3, wherein the light emitting elements are disposed between the first barrier wall portion and the second barrier wall portion.

7. The display device of claim 3, wherein the first barrier wall portion, the second barrier wall portion, the bank portion, and the sub-barrier wall portion are integral with each other.

8. The display device of claim 1, wherein the display device comprises an emission area overlapping the light emitting elements in a plan view, and a sub-region spaced apart from the emission area, the first opening is disposed in the emission area, and the second opening is disposed in the sub-region.

9. The display device of claim 8, wherein a first contact portion and a second contact portion spaced apart from the first contact portion are disposed in the sub-region, the first contact electrode electrically contacts the first electrode through the first contact portion penetrating the bank layer and the first insulating layer, and the second contact electrode electrically contacts the second electrode through the second contact portion penetrating the bank layer and the first insulating layer.

* * * * *